(12) United States Patent
Kobayashi et al.

(10) Patent No.: US 7,936,742 B2
(45) Date of Patent: May 3, 2011

(54) DIGITAL SIGNAL DEMULTIPLEXING DEVICE AND MULTIPLEXING DEVICE

(75) Inventors: Kiyoshi Kobayashi, Yokosuka (JP); Hiroshi Tanaka, Yokosuka (JP); Hiroshi Kazama, Yokosuka (JP)

(73) Assignee: Nippon Telegraph and Telephone Corporation, Tokyo (JP)

( * ) Notice: Subject to any disclaimer, the term of this patent is extended or adjusted under 35 U.S.C. 154(b) by 106 days.

(21) Appl. No.: 12/296,758

(22) PCT Filed: May 18, 2007

(86) PCT No.: PCT/JP2007/060268
§ 371 (c)(1),
(2), (4) Date: Oct. 10, 2008

(87) PCT Pub. No.: WO2007/136010
PCT Pub. Date: Nov. 29, 2007

(65) Prior Publication Data
US 2009/0304031 A1    Dec. 10, 2009

(30) Foreign Application Priority Data
May 19, 2006   (JP) .................................. 2006-140361

(51) Int. Cl.
*H04J 1/02* (2006.01)
(52) U.S. Cl. ......... 370/343; 370/497; 375/285; 375/350
(58) Field of Classification Search .................. 370/497, 370/343
See application file for complete search history.

(56) References Cited

U.S. PATENT DOCUMENTS

| 6,714,529 B1 * | 3/2004 | Tanabe et al. ................. 370/343 |
| 2002/0156820 A1 * | 10/2002 | Kishi ........................... 708/300 |

FOREIGN PATENT DOCUMENTS

| JP | 63 6929 | 1/1988 |
| JP | 8 46654 | 2/1996 |
| JP | 2001 111639 | 4/2001 |
| JP | 3299952 | 4/2002 |

OTHER PUBLICATIONS

U.S. Appl. No. 12/441,981, filed Mar. 19, 2009, Kobayashi, et al.

* cited by examiner

*Primary Examiner* — Seema S Rao
*Assistant Examiner* — Henry Baron
(74) *Attorney, Agent, or Firm* — Oblon, Spivak, McClelland, Maier & Neustadt, L.L.P.

(57) ABSTRACT

A frequency digital signal demultiplexing apparatus including: demultiplexing filter bank units connected in a multi-stage manner to form a demultiplexing filter bank, wherein each unit includes at least one filter for filtering an input signal in series with a down-sampler, and frequency conversion and decimator part to receive at least one of the received signal and output signals of each unit demultiplexing filter bank, which includes a frequency conversion part, for each input signal, to shift a frequency of an input signal, and at least one decimator part serially connected to an output of each frequency conversion part, the decimator part including a filter for performing band limitation of an input signal and a down-sampler for down-sampling an output signal of the filter and output a down-sampled signal.

8 Claims, 22 Drawing Sheets

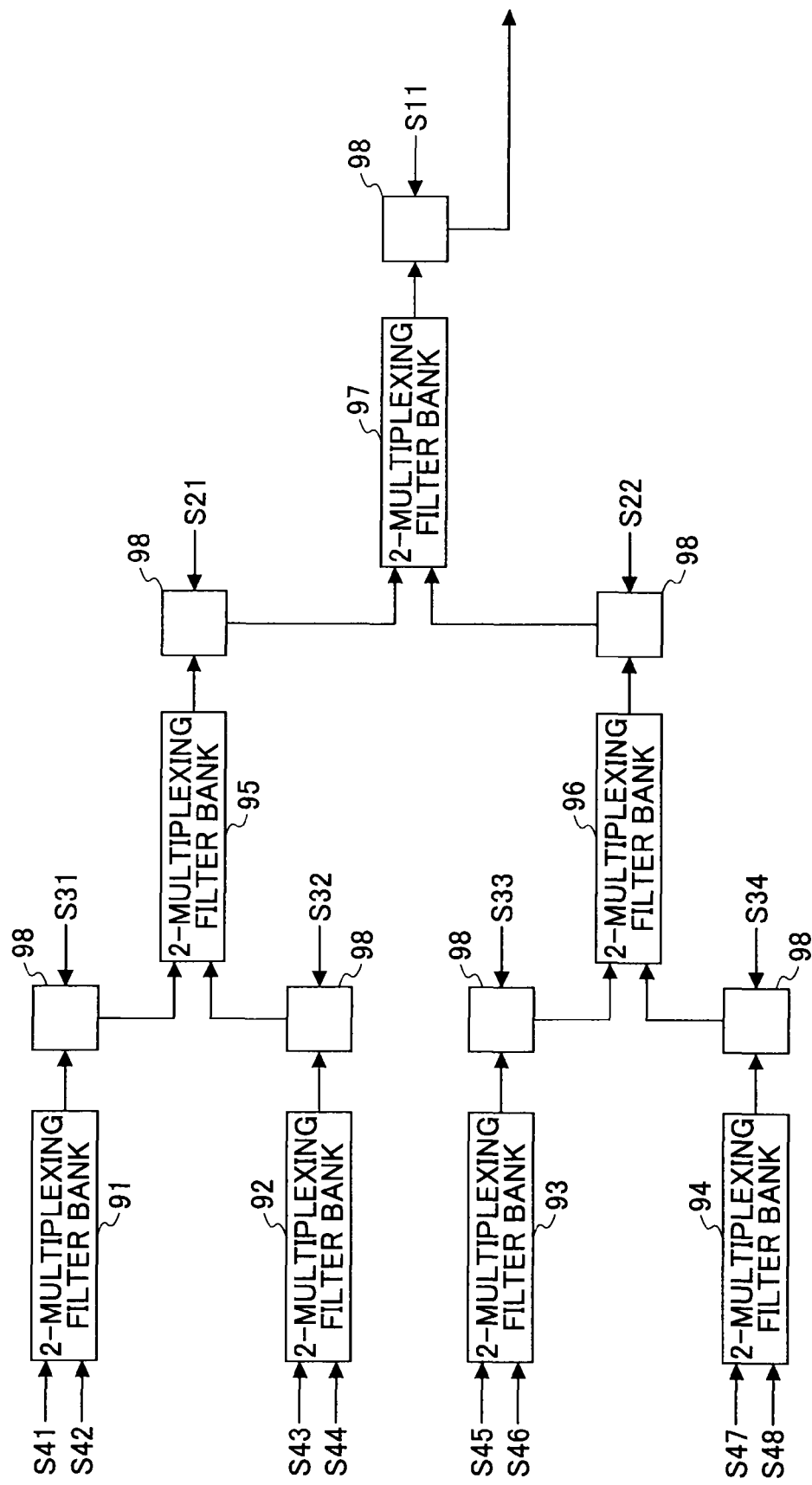

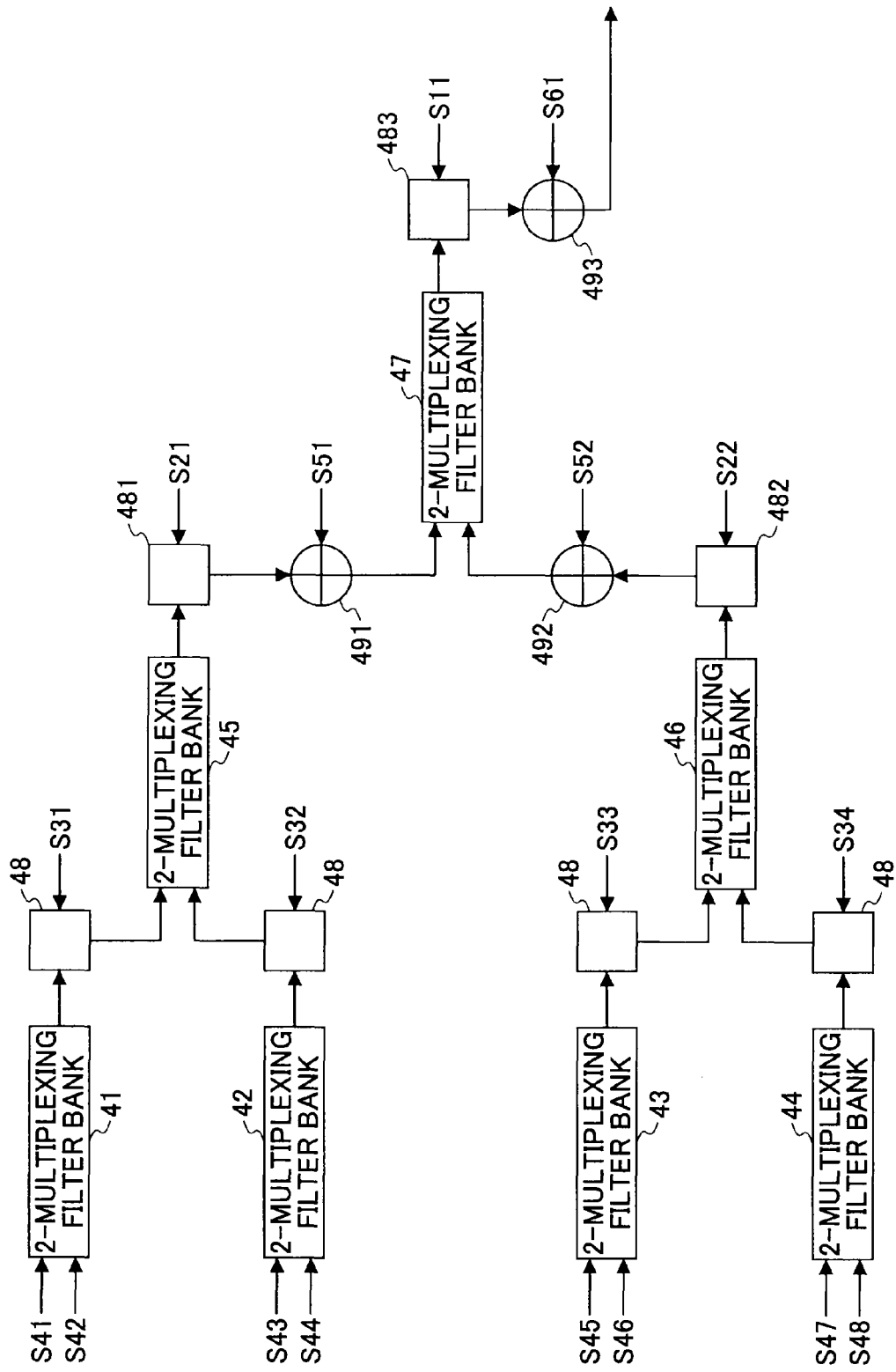

DIGITAL SIGNAL DEMULTIPLEXING DEVICE AND MULTIPLEXING DEVICE

TECHNICAL FIELD

The present invention relates to a digital signal demultiplexing apparatus for demultiplexing a plurality of signals that are frequency-multiplexed by digital signal processing, and to a digital signal multiplexing apparatus for frequency-multiplexing a plurality of signals by digital signal processing.

BACKGROUND ART

For configuring a demultiplexing apparatus for demultiplexing a received signal including a plurality of frequency-multiplexed signals to output demultiplexed signals or configuring a multiplexing apparatus for frequency-multiplexing a plurality of input signals to output a multiplexed signal by using analog circuits, the same number of filter and frequency conversion circuits as the number of signals become necessary. Thus, there is a problem in that apparatus size and adjusting parts of the apparatus increase. As a method for solving this problem, a digital signal demultiplexing apparatus and a digital signal multiplexing apparatus which are collective type and use digital signal processing circuits are proposed (refer to patent document 1, for example).

FIG. 1 is a block diagram of the digital signal demultiplexing apparatus described in the patent document 1, and shows a case for demultiplexing up to eight signals to output them. According to FIG. 1, the digital signal demultiplexing apparatus hierarchically connects 2-demultiplexing filter banks 81-87 each having one input and two outputs. In more detail, the second stage 2-demultiplexing filter banks 82 and 83 are connected to the first stage 2-demultiplexing filter bank 81, the third stage 2-demultiplexing filter banks 84 and 85 are connected to the second stage 2-demultiplexing filter bank 82, and the third stage 2-demultiplexing filter banks 86 and 87 are connected to the second stage 2-demultiplexing filter bank 83.

As shown in FIG. 3A, each of the 2-demultiplexing filter banks is configured by a low-pass filter and a high-pass filter each performing band limitation for input signals, and down-samplers connected to an output of the low-pass filter and an output of the high-pass filter. The down-sampler has a function for alternately thinning out sample values of the input signal, that is, down-sampling a sampling frequency into half.

In the digital signal demultiplexing apparatus disclosed in the patent document 1, frequency characteristics of each low-pass filter of the 2-demultiplexing filter banks 81, 82, 84 and 86 correspond to a filter A shown in FIG. 4, and frequency characteristics of each high-pass filter of the same 2-demultiplexing filter banks correspond to a filter B in FIG. 4, and frequency characteristics of each low-pass filter of the 2-demultiplexing filter banks 83, 85 and 87 correspond to a filter C shown in FIG. 4, and frequency characteristics of each high-pass filter of the same 2-demultiplexing filter banks correspond to a filter D in FIG. 4. In addition, a 2-demultiplexing filter bank including the filter A and the filter B is connected as a subsequent stage of the filter A or C, and a 2-demultiplexing filter bank including the filter C and the filter D is connected to a subsequent stage of the filter B or D. By the way, the frequency characteristics of each filter shown in FIG. 4 are obtained by performing normalization using a sampling frequency fs of the signal input to the 2-demultiplexing filter bank.

Each of the 2-demultiplexing filter banks divides an input signal into two signals on the frequency axis using the low-pass filter and the high-pass filter, and down-samples each of the divided signals to output them. The digital signal frequency demultiplexing apparatus shown in FIG. 1 performs demultiplexing processes by hierarchically connecting a predetermined number of stages of these 2-demultiplexing filter banks. In the configuration, the predetermined number of the stages is $\log_2 N$ for a maximum number N for demultiplexing processes.

FIG. 5 is a diagram showing relationship between frequency bands and frequency positions for signals that can be processed by the digital signal demultiplexing apparatus for demultiplexing up to eight signals shown in FIG. 1. Signal names in the figure correspond to signal names shown in FIG. 1. By the way, a sampling frequency Fs in FIG. 5 is a sampling frequency of an input signal to the 2-demultiplexing filter bank 81 of the first stage.

FIG. 2 is a block diagram of a digital signal multiplexing apparatus described in the patent document 1. According to FIG. 2, in the digital signal multiplexing apparatus, 2-multiplexing filter banks 91-97 each having two inputs and one output are connected hierarchically. More particularly, 2-multiplexing filter banks 91 and 92 of the first stage are connected to a 2-multiplexing filter bank 95 of the second stage via selectors 98, 2-multiplexing filter banks 93 and 94 of the first stage are connected to a 2-multiplexing filter bank 96 of the second stage via selectors 98, and the 2-multiplexing filter banks 95 and 96 of the second stage are connected a 2-multiplexing filter bank 97 of the third stage via selectors 98.

As shown in FIG. 3B, each of the 2-multiplexing filter banks includes up-samplers, provided for each of the two input signals, for doubling the sampling frequency by interpolating a sample value of 0 between sample values of the input signal, a low-pass filter for limiting the band of an output signal from one up-sampler, a high-pass filter for limiting a band of an output signal of another up-sampler, and an adder for adding an output signal of the low-pass filter and an output signal of the high-pass filter to output the added signal.

In the digital signal multiplexing apparatus disclosed in the patent document 1, frequency characteristics of each low-pass filter of the 2-multiplexing filter banks 91, 93, 95 and 97 correspond to the filter A shown in FIG. 4, and frequency characteristics of each high-pass of the same filter banks correspond to the filter B in FIG. 4. Frequency characteristics of each low-pass filter of the 2-multiplexing filter banks 92, 94 and 96 correspond to the filter C shown in FIG. 4, and frequency characteristics of each high-pass filter of the same filter banks correspond to the filter D in FIG. 4. A 2-multiplexing filter bank including the filter A and the filter B is connected to a previous stage of the filter A or C, and a 2-multiplexing filter bank including the filter C and the filter D is connected to a previous stage of the filter B or D. By the way, frequency characteristics of each filter shown in FIG. 4 are obtained by performing normalization using a sampling frequency fs of an output signal of the 2-multiplexing filter bank.

Each of the 2-multiplexing filter banks up-samples each of the two input signals into doubled sampling frequency, and removes unnecessary harmonic component using the low-pass filter and the high-pass filter to frequency-multiplex and output signals such that they are arranged adjacent with each other on the frequency axis. The digital signal multiplexing apparatus shown in FIG. 2 performs multiplexing processing by connecting a predetermined number of stages of these 2-multiplexing filter banks hierarchically. The predetermined number of the stages is $\log_2 N$ for a maximum number N for multiplexing processes. In addition, the selector 98 connected to an output of each 2-multiplexing filter bank is for selecting a signal between a frequency multiplexed signal output by the 2-multiplexing signal and a signal having a bandwidth same as that of the frequency multiplexed signal, and an output of the selector 98 becomes an input signal of a 2-multiplexing filter bank of a next stage.

FIG. 5 is a diagram showing relationship between frequency bands and frequency positions for signals that can be processed by the digital signal multiplexing apparatus for multiplexing up to eight signals shown in FIG. 2. Signal names in the figure correspond to signal names shown in FIG. 2. By the way, a sampling frequency Fs in FIG. 5 is a sampling frequency of an output signal of the 2-multiplexing filter bank 97 of the last stage.

[Patent document 1] Japanese Patent No. 3299952

DISCLOSURE OF THE INVENTION

Problem to be Solved by the Invention

The 2-demultiplexing filter banks and the 2-multiplexing filter banks in the digital signal demultiplexing apparatus and the digital signal multiplexing apparatus according to the conventional technique shown in FIGS. 1 and 2 are classified into one that uses the filter A and the filter B of FIG. 4 and one that uses the filter C and the filter D of FIG. 4. In either case, it is not possible to process a signal of a frequency band that straddles a boundary of the filters. Therefore, some signals can be processed but the others cannot be processed according to bandwidths and frequency positions of the frequency multiplexed signals.

For example, FIG. 6A shows a case using signals S41, S32 and S22 shown in FIG. 5. In addition, FIG. 6B shows a case using signals S31, S43-S46 shown in FIG. 5. They are combinations that can be processed by the conventional digital signal demultiplexing apparatus and the digital signal multiplexing apparatus.

However, signal groups shown in FIG. 6C and FIG. 6D are combinations that cannot be processed by the conventional digital signal demultiplexing apparatus and the digital signal multiplexing apparatus. As seen above, since a signal that straddles a passband boundary between the low-pass filter and the high-pass filter in the 2-demultiplexing or 2-multiplexing filter bank suffers a loss in frequency spectrum, the signal cannot be frequency-demultiplexed or frequency-multiplexed. Thus, it is necessary to provide restrictions in relationship between the frequencies and bandwidths of frequency-multiplexed signals in communications using the conventional digital signal demultiplexing apparatus and the digital signal multiplexing apparatus.

Therefore, an object of the present invention is to provide a digital signal demultiplexing apparatus and a digital signal multiplexing apparatus that can remove the above-mentioned restriction for signals that can be processed and that can flexibly select a signal bandwidth and a frequency position for use in the frequency multiplexed signal.

Means for Solving the Problem

According to an embodiment of the present invention, the above problem can be solved, and a digital signal demultiplexing apparatus for demultiplexing a received signal including a plurality of signals that are arbitrarily frequency-multiplexed to output demultiplexed signals is provided. The digital signal demultiplexing apparatus includes:

demultiplexing filter bank means including a configuration in which unit demultiplexing filter banks are connected in a multistage manner, each unit demultiplexing filter bank including one or more filters for filtering an input signal and a down-sampler for down-sampling an output signal of each filter to output an down-sampled signal; and frequency conversion and decimator means configured to receive at least one of the received signal and output signals of each unit demultiplexing filter bank, wherein the frequency conversion and decimator means includes frequency conversion means, for each input signal, configured to shift a frequency of an input signal and output a shifted signal, and one or more decimator means serially connected to an output of each frequency conversion means, and the decimator means includes a filter for performing band limitation of an input signal and a down-sampler for down-sampling an output signal of the filter and output a down-sampled signal.

According to an embodiment of the present invention, the above problem can be solved, and digital signal multiplexing apparatus for arbitrarily frequency-multiplexing a plurality of input signals and outputting a frequency-multiplexed signal is provided. The digital signal multiplexing apparatus includes:

multiplexing filter bank means including a configuration in which unit multiplexing filter banks are connected in a multistage manner, each unit multiplexing filter bank including one or more up-samplers for up-sampling an input signal and output an output signal, and a filter for removing unnecessary component of the output signal of each up-sampler to output an output signal; and frequency conversion and interpolator means configured to output at least one signal to be added to any one of output signals of the unit demultiplexing filter banks, wherein the frequency conversion and interpolator means includes combinations each of which has one or more serially connected interpolator means and frequency conversion means configured to shift a signal output by last interpolator means to output a frequency-shifted signal, the number of the combinations being the same as the number of output signals, and the interpolator means includes an up-sampler for up-sampling an input signal to output an output signal, and a filter for removing unnecessary signal component of the output signal of the up-sampler to output an output signal.

EFFECT OF THE INVENTION

The digital signal demultiplexing apparatus makes it possible to use a signal that straddles a boundary between frequency bands fixedly divided by the demultiplexing filter bank means by shifting the frequency using the frequency conversion means. The frequency shift amount in the frequency converter means is determined based on passband of the decimator means that is connected to the subsequent stage. More particularly, the frequency shift amount in the frequency converter means is determined by the passband of the decimator means, and frequency position of a signal that is a subject for separation in signals included in the input signal. As seen above, it becomes possible to process a signal of arbitrary frequency and band by providing the frequency conversion and decimator means for a signal that straddles a boundary. In addition, for other signals, they are demultiplexed by the demultiplexing filter bank means, so it is not necessary to provide the frequency conversion and decimator means for each signal. Thus, circuit size can be made small.

Similarly, the digital signal multiplexing apparatus of the present invention makes it possible to use a signal that straddles a boundary between fixed frequency bands in the multiplexing filter bank means by shifting the frequency using the frequency conversion means. The frequency shift amount in the frequency converter means is determined by passband of the interpolator means that are serially connected to the previous stage. More particularly, the frequency shift amount in the frequency converter means is determined by passband of the interpolator means that are connected to the previous stage and a frequency position of a signal that is filtered by the filter in the frequency multiplexed signal. As seen above, it becomes possible to process a signal of arbitrary frequency and band by providing the frequency conversion and interpolator means for a signal that straddles a boundary. In addition, for other signals, they are multiplexed by the multiplexing filter bank means, so it is not necessary to provide the frequency conversion and interpolator means for each signal. Thus, circuit size can be made small.

BRIEF DESCRIPTION OF THE DRAWINGS

FIG. 2 is a block diagram of a digital signal multiplexing apparatus according to a conventional technique;

FIG. 11 is a block diagram of a multiplexing filter bank unit;

Figure 1:
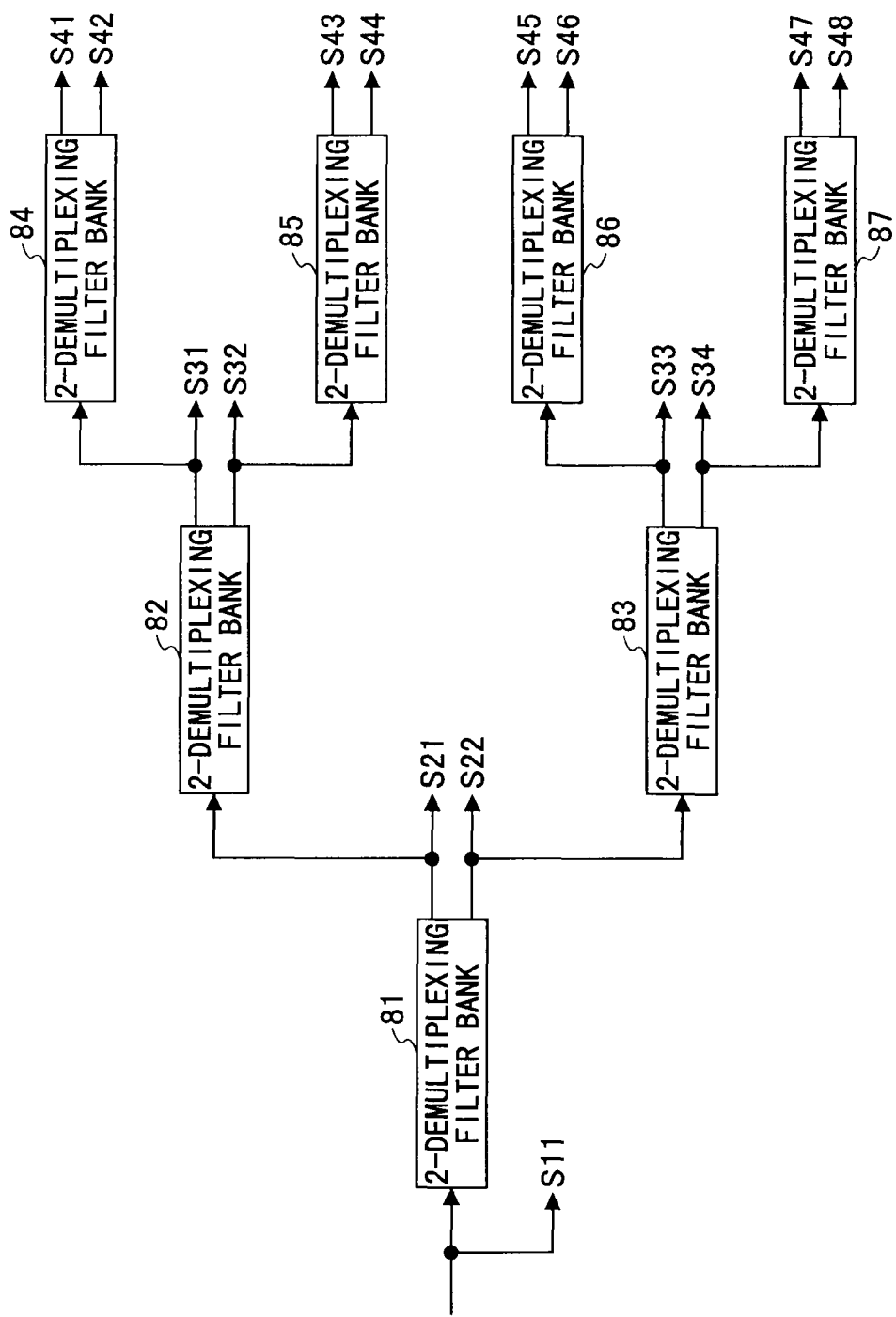
FIG. 1 is a block diagram of a digital signal demultiplexing apparatus according to a conventional technique.

DESCRIPTION OF REFERENCE SIGNS 1 demultiplexing filter bank unit
11-17, 81-87 2-demultiplexing filter bank
2 frequency conversion and decimator unit
21-23, 55-57, 63, 67 frequency converter
24-27, 64 decimator
201, 502 low-pass filter
202, 603, 604 down-sampler
3 switch matrix unit
4 multiplexing filter bank unit
41-47, 91-97 2-demultiplexing filter bank
48 selector
49, 705 adder
5 frequency conversion and interpolator unit
51-54 interpolator
58, 98 selector
501, 702 up-sampler
61 band variable 2-demultiplexing filter bank
62, 73 memory
65 serial-parallel converter
601, 703 variable low-pass filter
602, 704 variable high-pass filter
66, 76 time-division operation control unit
71 parallel-serial converter
72 band variable 2-multiplexing filter bank
74 interpolator

PREFERRED EMBODIMENTS FOR CARRYING OUT THE INVENTION

In the following, preferred embodiments for carrying out the present invention are described in detail using figures.

Figure 7:
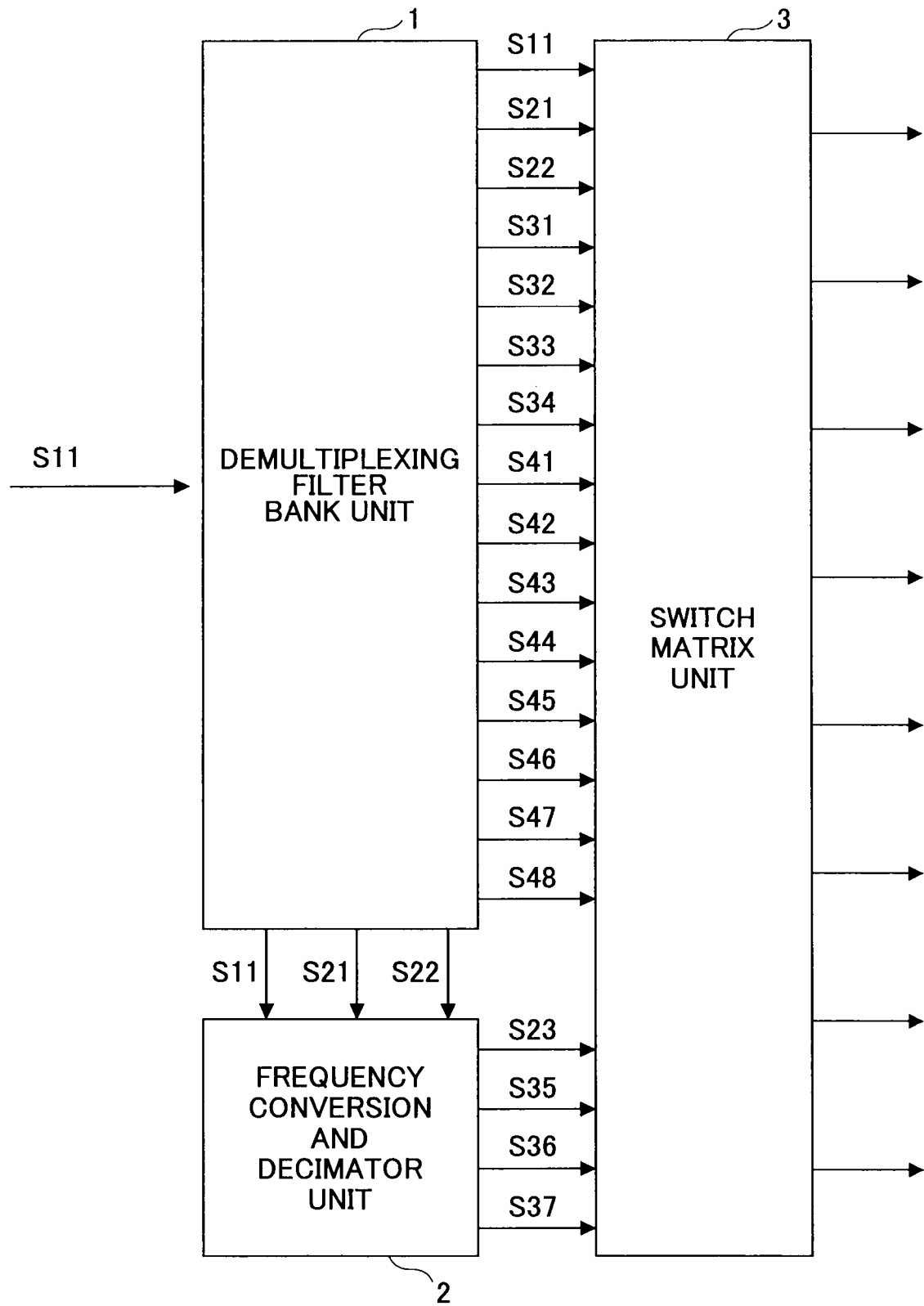
FIG. 7 is a block diagram of a digital signal demultiplexing apparatus in an embodiment of the present invention.

FIG. 7 is a block diagram of a digital signal demultiplexing apparatus in an embodiment of the present invention. In the following, although a configuration for demultiplexing up to eight signals is described, the number of signals that can be processed can be changed according to the disclosed content. As shown in FIG. 7, the digital signal demultiplexing apparatus of the present embodiment includes a demultiplexing filter bank unit 1, a frequency conversion and decimator unit 2, and a switch matrix unit 3.

Figure 8:
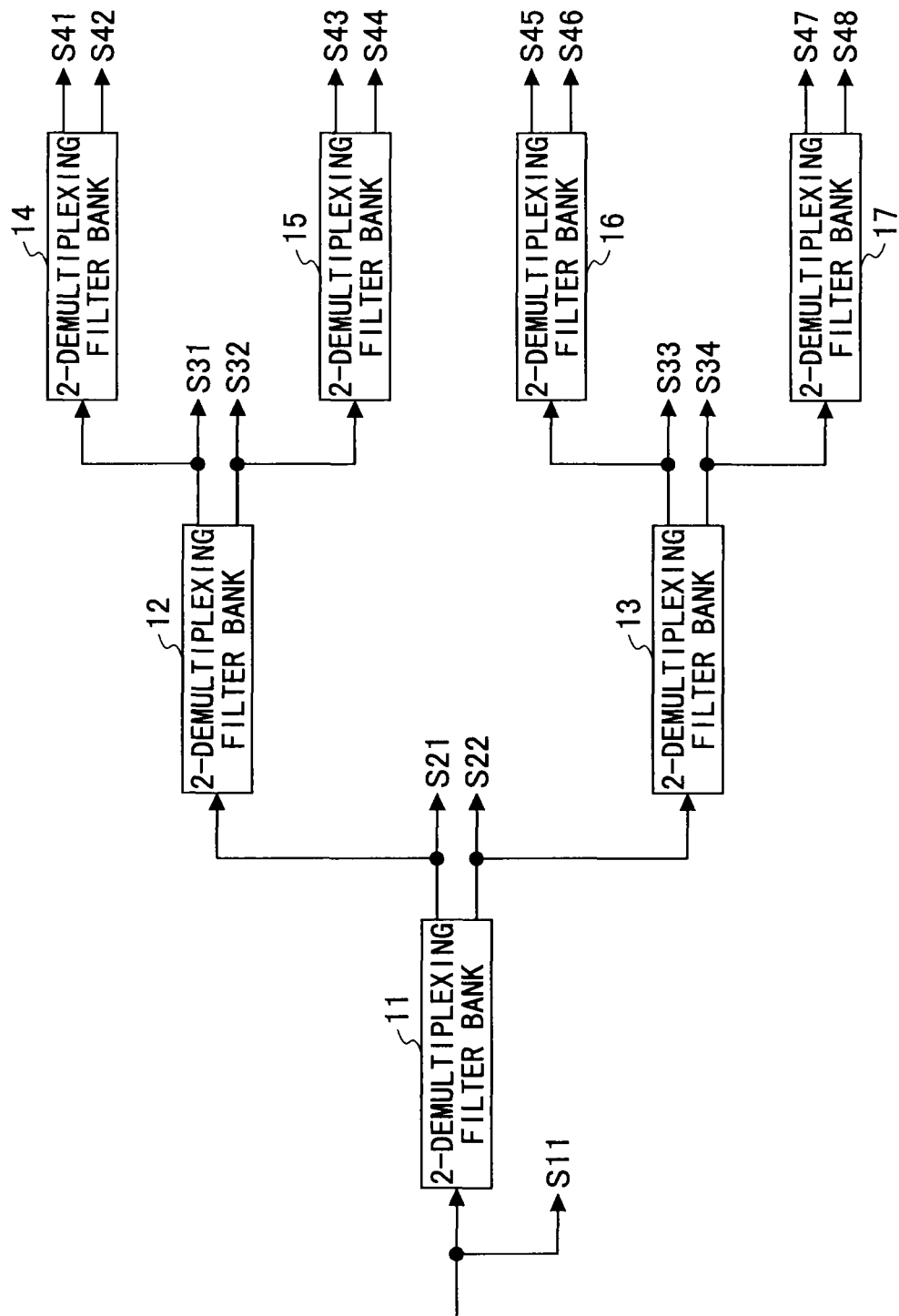
FIG. 8 is a block diagram of a demultiplexing filter bank unit.

FIG. 8 is a block diagram of the demultiplexing filter bank unit 1 shown in FIG. 7. According to FIG. 8, the demultiplexing filter bank unit 1 hierarchically connects 2-demultiplexing filter banks 11-17 each having one input and two outputs. In more detail, the second stage 2-demultiplexing filter banks 12 and 13 are connected to the first stage 2-demultiplexing filter bank 11, the third stage 2-demultiplexing filter banks 14 and 15 are connected to the second stage 2-demultiplexing filter bank 12, and the third stage 2-demultiplexing filter banks 16 and 17 are connected to the second stage 2-demultiplexing filter bank 13.

Figure 3A:
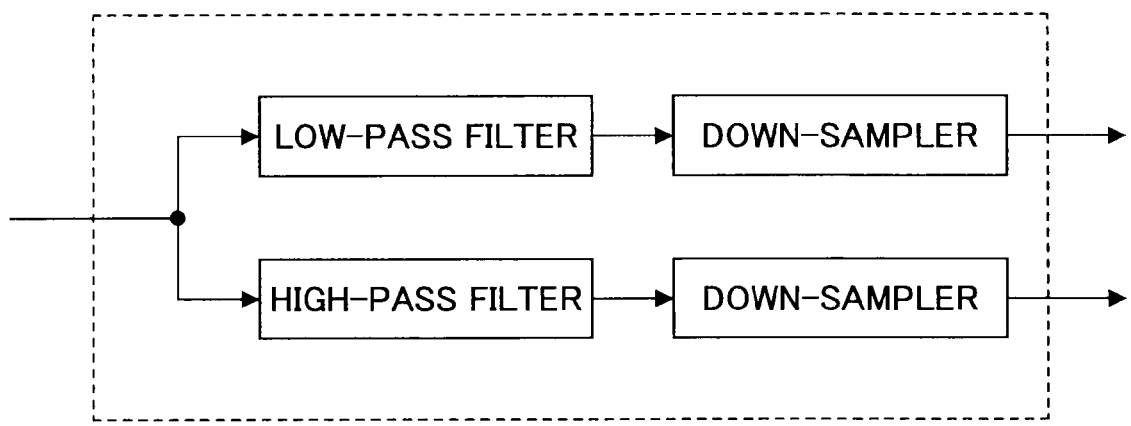
FIG. 3A is a block diagram of a 2-demultiplexing filter bank.

As shown in FIG. 3A, each of the 2-demultiplexing filter banks is configured by a low-pass filter and a high-pass filter each performing band limitation for input signals, and down-samplers connected to an output of the low-pass filter and to an output of the high-pass filter. The down-sampler has a function for alternately thinning out sample values of the input signal, that is, down-sampling a sampling frequency into half.

Figure 4:
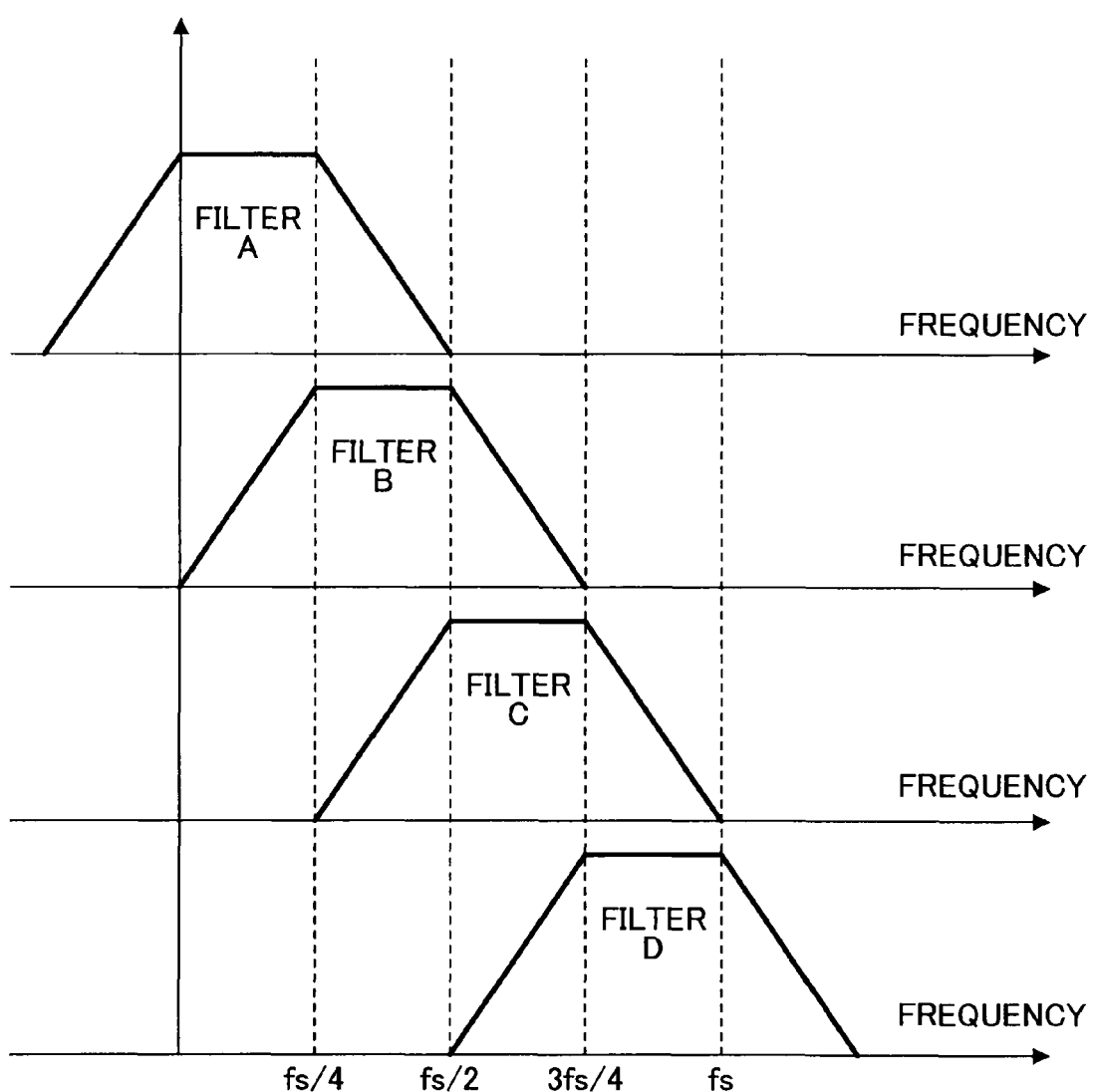
FIG. 4 is a diagram showing frequency characteristics of filters used in the 2-demultiplexing filter bank and the 2-multiplexing filter bank.
Figure 5:
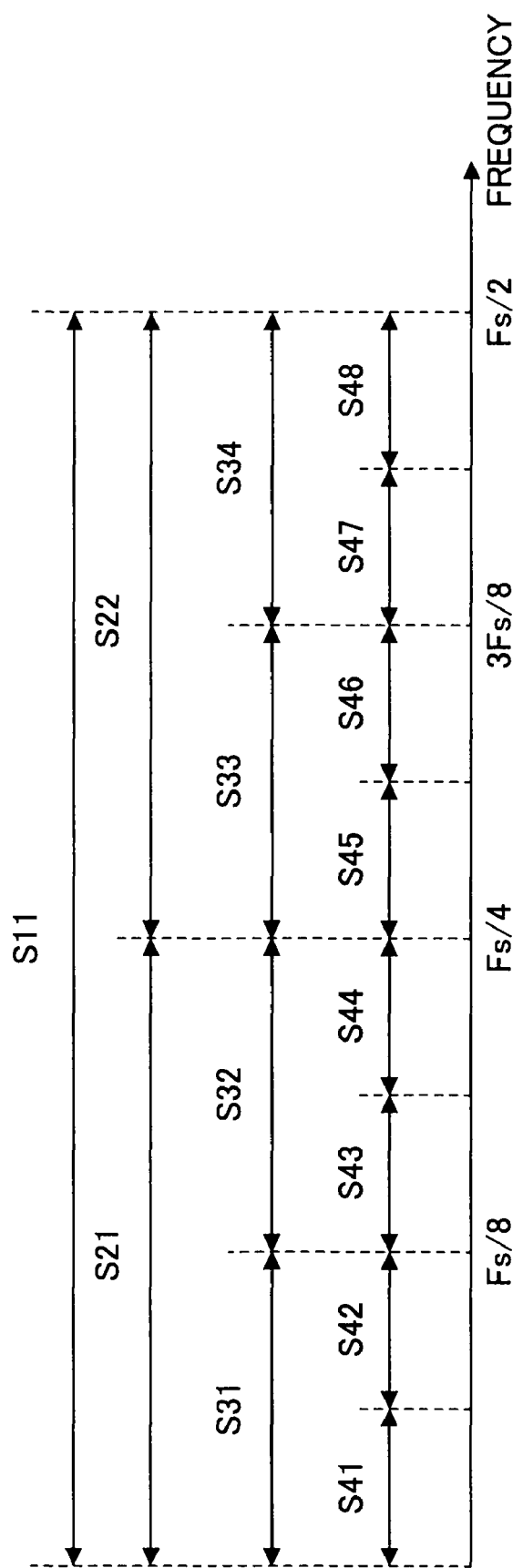
FIG. 5 is a diagram showing relationship of frequency bands of each signal in the digital signal demultiplexing apparatus and the digital signal multiplexing apparatus for performing signal processing for up to eight signals according to a conventional technique.

In the configuration, frequency characteristics of each low-pass filter of the 2-demultiplexing filter banks 11, 12, 14 and 16 correspond to the filter A shown in FIG. 4, and frequency characteristics of each high-pass filter of the same 2-demultiplexing filter banks correspond to the filter B in FIG. 4, and frequency characteristics of each low-pass filter of the 2-demultiplexing filter banks 13, 15 and 17 correspond to the filter C shown in FIG. 4, and frequency characteristics of each high-pass filter of the same 2-demultiplexing filter banks correspond to the filter D in FIG. 4. Then, filers A and B are used for a 2-demultiplexing filter bank of the first stage, and after that, a 2-demultiplexing filter bank including the filter A and the filter B is connected to a subsequent stage of the filter A or C, and a 2-demultiplexing filter bank including the filter C and the filter D is sequentially connected to a subsequent stage of the filter B or D. By the way, the frequency characteristics of each filter shown in FIG. 4 are obtained by performing normalization using a sampling frequency fs of the signal input to the 2-demultiplexing filter bank such that the passband falls within 0-fs.

The 2-demultiplexing filter bank 11 filters the input signal S11 to the demultiplexing filter bank unit 1 using the low-pass filter and the high-pass filter which have different passbands so as to extract two signals having different frequency bands, and down-samples each of the extracted signals to output them as signals S21 and S22. After that, in the same way, the 2-demultiplexing filter bank unit 12 receives the signal S21 to output signals S31 and S32. The 2-demultiplexing filter bank unit 13 receives the signal S22 to output signals S33 and S34. In addition, 2-demultiplexing filter banks 14, 15, 16 and 17 receive signals S31, S32, S33 and S34 respectively to output signals S41 and S42, signals S43 and S44, signals S45 and S46 and signals S47 and S48.

By the way, the demultiplexing filter bank unit 1 of the digital signal demultiplexing apparatus of the embodiment of the present invention is not limited to the above-mentioned configuration as long as the apparatus is configured to sequentially perform, using multiple stage configuration, dividing a frequency multiplexed signal to fixed frequency bands and outputting signals included in each frequency band. For example, the demultiplexing filter bank unit 1 may be configured by hierarchically connecting unit demultiplexing filter banks in a multistage manner, in which each of the unit demultiplexing filter banks has one or more filters and a down-sampler for down-sampling output signals of each filter to output signals. The 2-demultiplexing filter bank is an example of the unit demultiplexing filter bank.

Figure 9A:
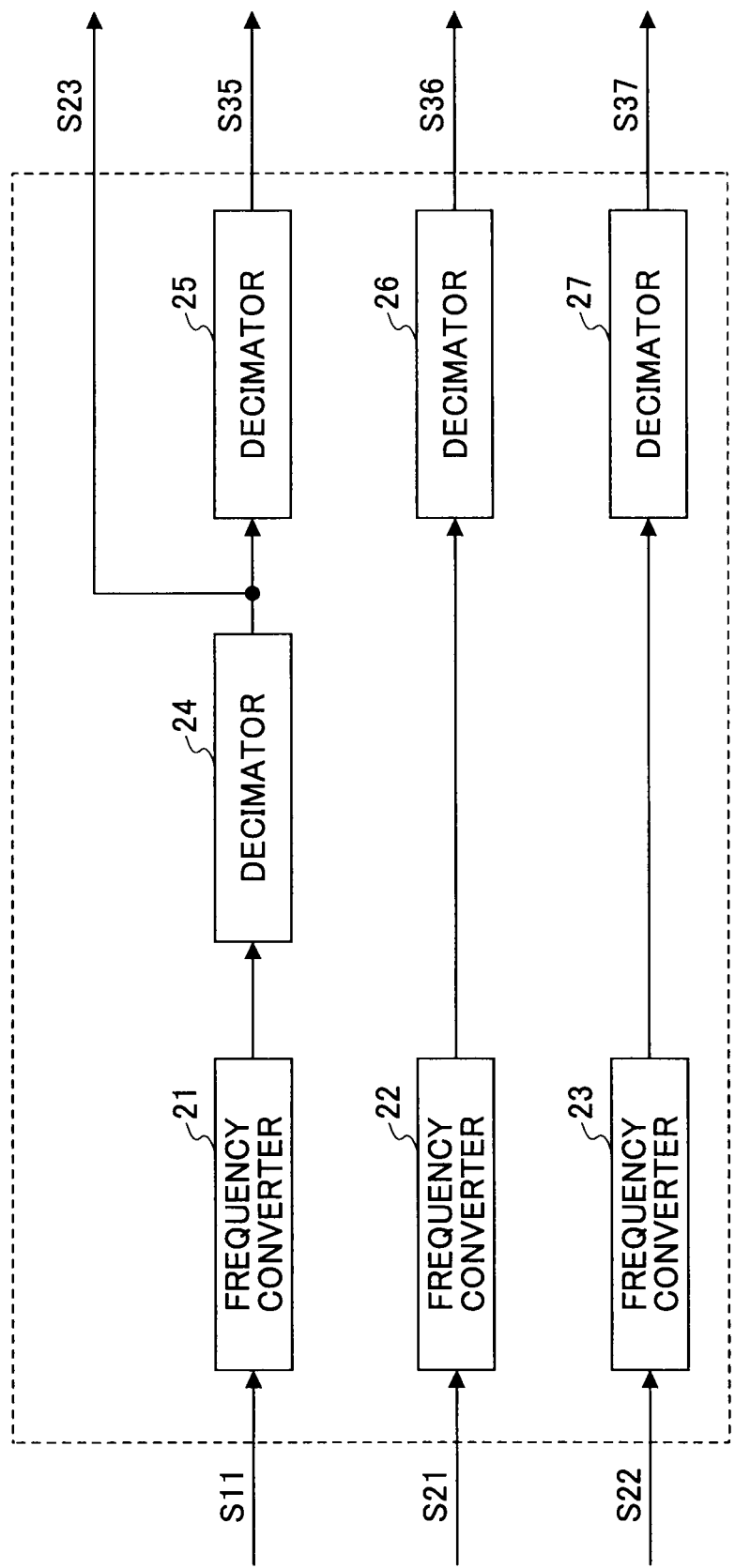
FIG. 9A is a block diagram of a frequency conversion and decimator unit.
Figure 9B:
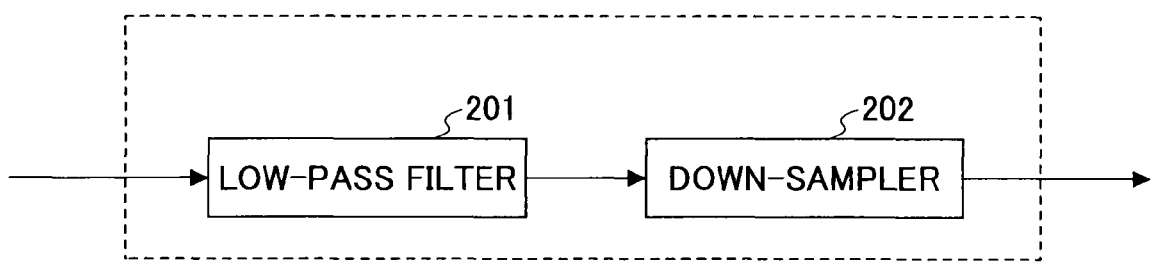
FIG. 9B is a block diagram of a decimator.

FIG. 9A is a block diagram of the frequency conversion and decimator unit 2. As shown in FIG. 9A, the frequency conversion and decimator unit 2 includes frequency converters 21-23 and decimators 24-27. As shown in FIG. 9B, each decimator includes a low-pass filter 201 for performing band limitation for an input signal, and a down-sampler 202. The down-sampler 202 has a function for alternately thinning out sample values of the input signal, that is, down-sampling the sampling frequency into half. As the low-pass filter 201, one of the filters A-D is used. In this example, the sampling frequency fs is a sampling frequency of an input signal of the decimator.

The frequency converters 21, 22 and 23 respectively perform frequency conversion for signals S11, S21 and S22 output from the demultiplexing filter bank unit 1. That is, the frequency converters 21, 22 and 23 shift frequency of the input signal. More particularly, each frequency converter multiplies an input signal I(t) by $e^{j(2\pi ft+\theta)}$ to output a signal obtained by $O(t)=I(t)*e^{j(2\pi ft+\theta)}$, wherein t is time, f is a frequency difference between the output signal and the input signal, that is, a shift amount of the frequency, and $\theta$ is an arbitrary phase.

The decimator 24 performs band limitation on an output signal of the frequency converter 21 and down-samples the signal to output a signal S23. The decimator 25 receives the signal S23 to output a signal S35. Further, the decimator 26 receives the output signal of the frequency converter 22 to output a signal S36, and the decimator 27 receives an output signal of the frequency converter 23 to output a signal S37.

Figure 13:
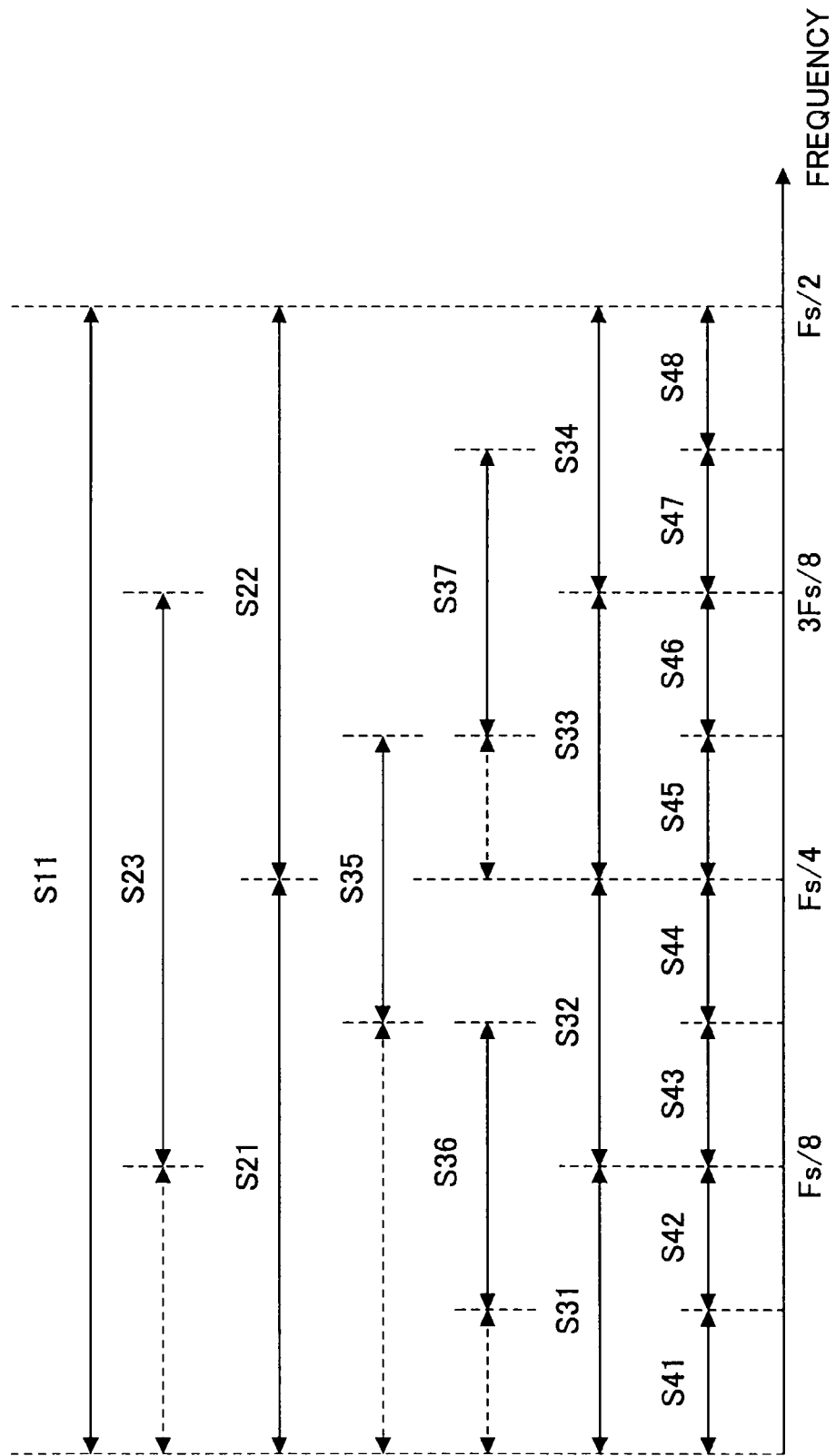
FIG. 13 is a diagram showing relationship among signals that can be used in the digital signal demultiplexing apparatus and the digital signal multiplexing apparatus in an embodiment of the present invention.

FIG. 13 shows frequency bands and relationship of frequency positions for the above-mentioned signals, in which the sampling frequency Fs is a sampling frequency of the input signal to the 2-demultiplexing filter bank 11. In addition, when using the signal S23, a frequency shift amount of the signal S11 in the frequency converter 21 is an amount indicated by an arrow with a dotted line located at the left side of the signal S23, and when using the signal S35, a frequency shift amount of the signal S11 in the frequency converter 21 is an amount indicated by an arrow with a dotted line located at the left side of the signal S35. In the same way, a frequency shift amount of the signal S21 in the frequency converter 22 is an amount indicated by an arrow with a dotted line located at the left side of the signal S36, and a frequency shift amount of the signal S22 in the frequency converter 23 is an amount indicated by an arrow with a dotted line located at the left side of the signal S37. By the way, these frequency shifts mean shifting to the left side by the amount according to each arrow with dotted line, that is, to a low frequency side.

In this case, as the low-pass filter 201 of the decimators 24, 25 and 26, the filter A shown in FIG. 4 is used, and the filter C shown in FIG. 4 is used for the low-pass filter 201 of the decimator 27. However, when shifting the signal S37 to have a same frequency of the signal S31 by increasing a shift amount of the frequency of the signal S22 in the frequency converter 23, the filter A of FIG. 4 can be also used as the low-pass filter 201 of the decimator 27. That is, the frequency shift amount in each frequency converter is determined based on frequency characteristics of the low-pass filter used for the one or more decimators that are serially connected to the subsequent stages. More particularly, the frequency shift amount in each frequency converter is determined by frequency characteristics of the low-pass filter used for the one or more decimators that are serially connected to subsequent stages and frequency position of a signal that is a subject for separation in signals included in the input signal. The frequency of the input signal is shifted such that the signal that is the subject for separation in signals included in the input signal falls within the passband of the decimator.

In addition, since the signals S23 and S35 cannot be used at the same time, circuits are shared for demultiplexing the signal S23 or the signal S35 from the signal S11. Therefore, it is necessary to change the frequency shift amount of the signal S11 in the frequency converter 21 according to whether a signal to be used is S23 or S35. Conversely, by configuring the frequency converter 21 to be able to change the frequency shift amount, the circuit for demultiplexing the signal S23 or S35 from the signal S11 can be shared so that the circuit size can be reduced small. In addition, by configuring the frequency converter to be able to change the frequency shift amount, since low-pass filters having same frequency characteristics can be used for all decimators. Thus, for example, when any two of the signals S35-S37 are used, it is only necessary to prepare two sets of circuits including the frequency converter and the decimators so that the circuit size can be reduced small.

By the way, the number of decimators serially connected after the frequency converter is equal to a difference between a stage number of the input signal and a stage number whose input bandwidth is identical to that of the decimators' output in the demultiplexing filter bank unit 1. That is, when demultiplexing the signal S35 from the signal S11, two decimators are connected serially. This is because the signal S11 is input of the first stage and bandwidth of the signal S35 is identical to the third stage's input signals S31-S34. Thus, by subtracting 1 from 3, the number of decimators is two.

Returning back to FIG. 7, the switch matrix unit 3 is for guiding signals to be actually used, in signals S11, S21-S22, S31-S34 and S41-S48 output by the demultiplexing filter bank unit 1 and signals S23 and S35-S37 output by the frequency conversion and decimator unit 2, to predetermined output ports of the digital signal demultiplexing apparatus, and is provided for changing a combination of signals to be used.

Figure 6A:
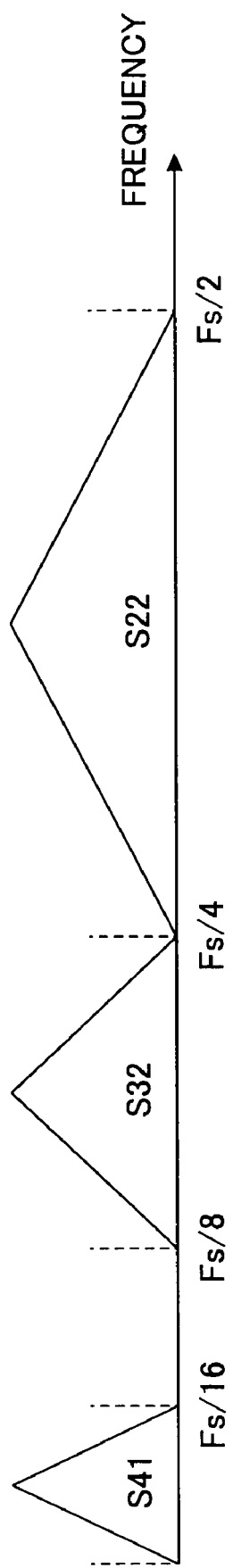
FIG. 6A is a diagram for explaining signals that can be processed in the digital signal demultiplexing apparatus and the digital signal multiplexing apparatus for performing signal processing for up to eight signals according to a conventional technique.
Figure 6B:
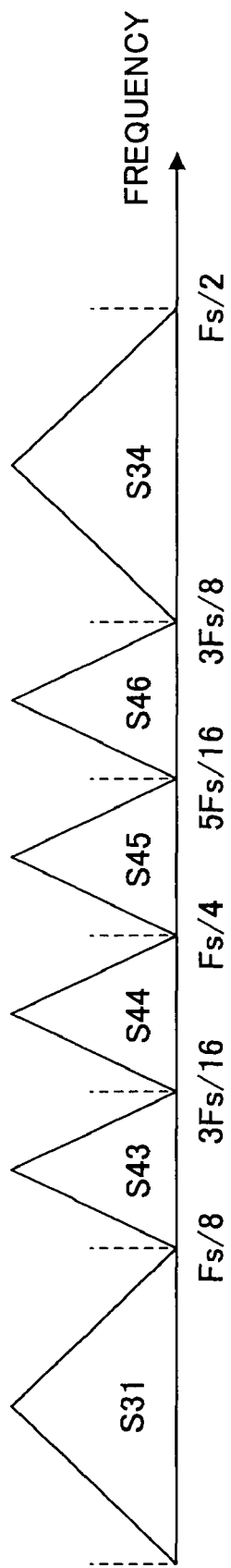
FIG. 6B is a diagram for explaining signals that can be processed and signals that cannot be processed in the digital signal demultiplexing apparatus and the digital signal multiplexing apparatus for performing signal processing for up to eight signals according to a conventional technique.
Figure 6C:
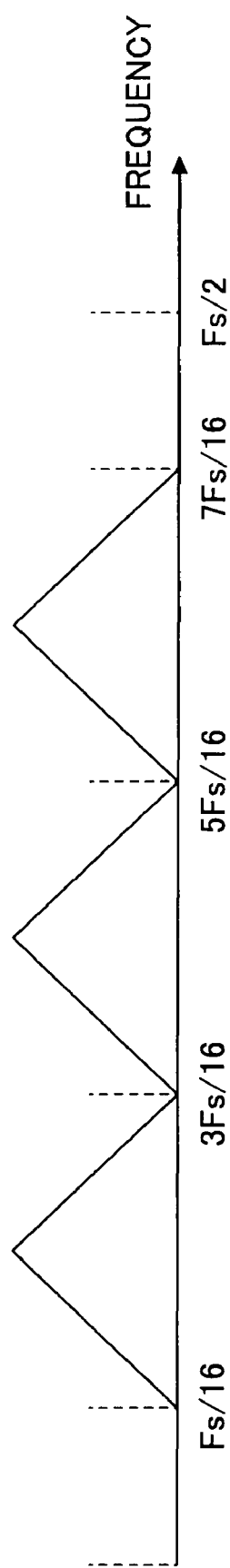
FIG. 6C is a diagram for explaining signals that cannot be processed in the digital signal demultiplexing apparatus and the digital signal multiplexing apparatus for performing signal processing for up to eight signals according to a conventional technique.
Figure 6D:
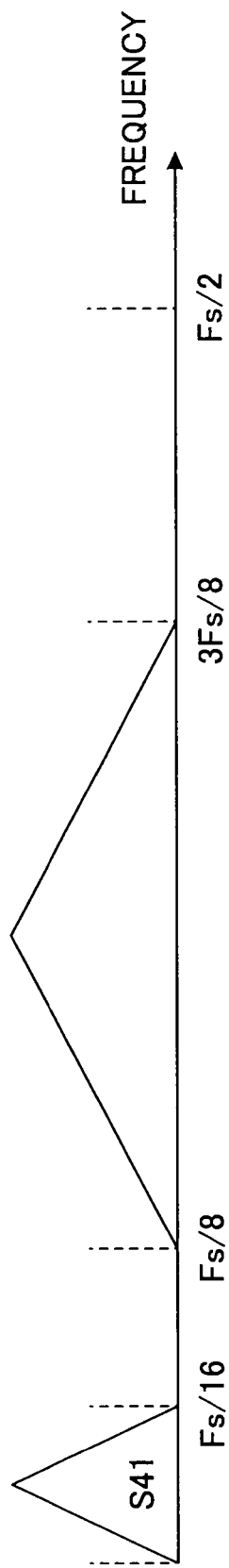
FIG. 6D is a diagram for explaining signals that cannot be processed in the digital signal demultiplexing apparatus and the digital signal multiplexing apparatus for performing signal processing for up to eight signals according to a conventional technique.

According to the above-mentioned configuration, restriction for combination of usable signals, which is the problem in the conventional technique, can be removed. For example, processing for signal groups shown in FIGS. 6C and 6D becomes possible.

Figure 10:
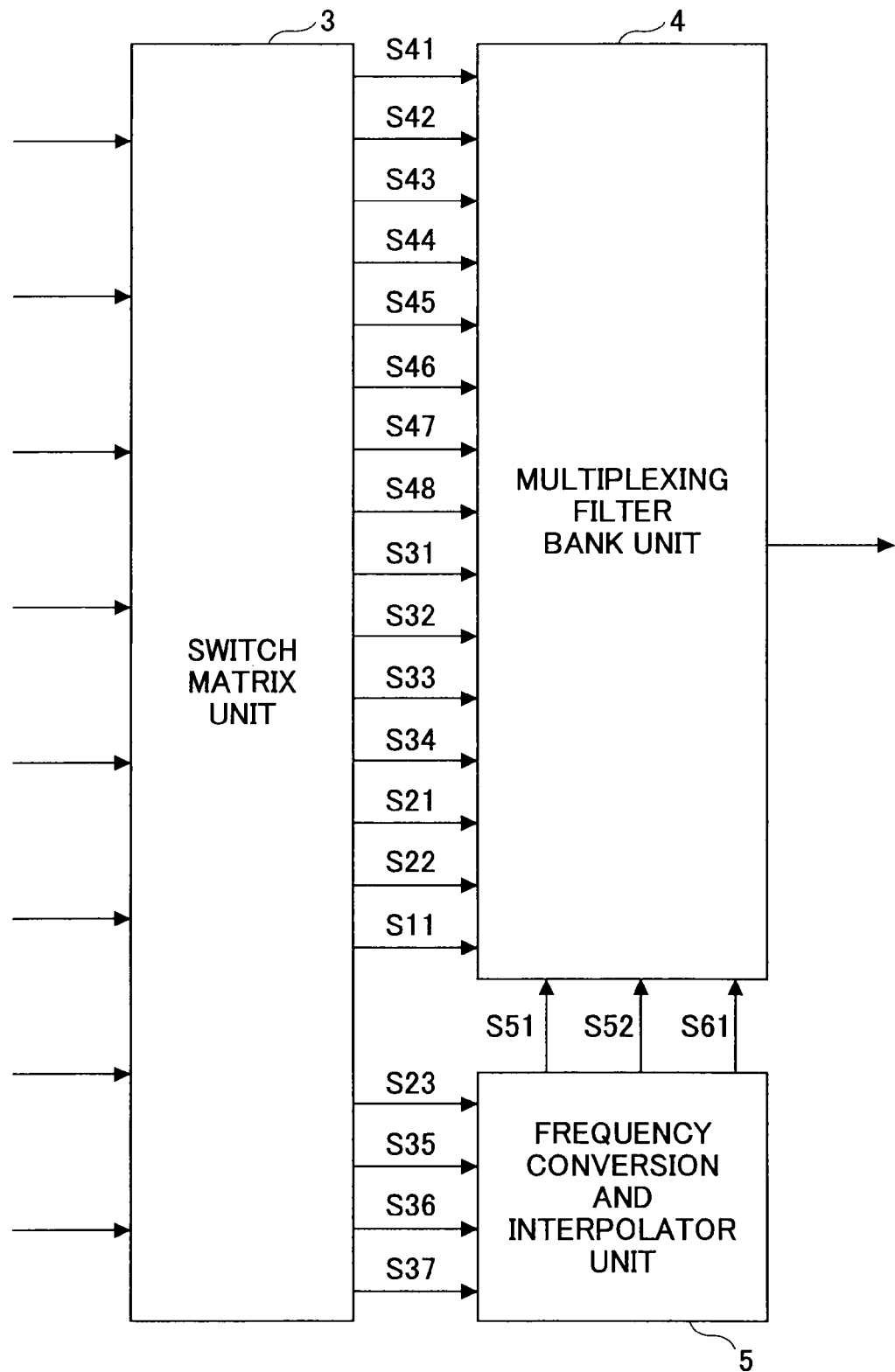
FIG. 10 is a block diagram of a digital signal multiplexing apparatus in an embodiment of the present invention.

FIG. 10 is a block diagram of the digital signal multiplexing apparatus in an embodiment of the present invention. In the following, although explanation is given using a configuration for multiplexing up to eight signal, the number of signals that can be processed can be changed according to disclosed content. According to FIG. 10, the digital signal multiplexing apparatus includes a multiplexing filter bank unit 4, a frequency conversion and interpolator unit 5, and a switch matrix unit 3.

FIG. 11 is a block diagram of the multiplexing filter bank unit 4 shown in FIG. 10. As shown in FIG. 11, the multiplexing filter bank unit 4 is configured by hierarchically connecting 2-multiplexing filter banks 41-47 each having two inputs and one output in a multistage manner. More particularly, 2-multiplexing filter banks 41 and 42 of the first stage are connected to the 2-multiplexing filter bank 45 of the second stage via selectors 48, and 2-multiplexing filter banks 43 and 44 of the first stage are connected to the 2-multiplexing filter bank 46 of the second stage via selectors 48. Further, an output of the 2-multiplexing filter bank 45 of the second stage is connected to the selector 481, an output of the selector 481 is connected to an adder 491, and an output of the adder 491 becomes one input of the 2-multiplexing filter bank 47. Similarly, an output of the 2-multiplexing filter bank 46 of the second stage is connected to the selector 482, an output of the selector 482 is connected to an adder 492, and an output of the adder 492 becomes another input of the 2-multiplexing filter bank 47. Further, an output of the 2-multiplexing filter bank 47 is connected to the selector 483, an output of the selector 483 is connected to the adder 493, and an output of the adder 493 becomes an output of the digital signal multiplexing apparatus.

Figure 3B:
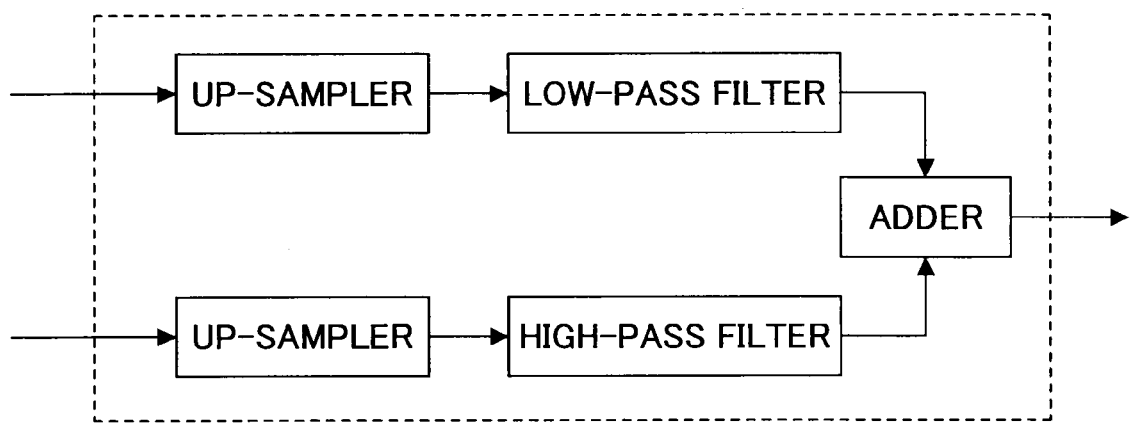
FIG. 3B is a block diagram of a 2-multiplexing filter bank.

As shown in FIG. 3B, each of the 2-multiplexing filter banks includes up-samplers, provided for each of the two input signals, for doubling the sampling frequency by interpolating a sample value of 0 between sample values of the input signal, a low-pass filter for limiting the band of an output signal from one up-sampler, a high-pass filter for limiting a band of an output signal of another up-sampler, and an adder for adding an output signal of the low-pass filter and an output signal of the high-pass filter to output the added signal.

In the configuration, frequency characteristics of each low-pass filter of the 2-multiplexing filter banks 41, 43, 45 and 47 correspond to the filter A shown in FIG. 4, and frequency characteristics of each high-pass of the same filter banks correspond to the filter B in FIG. 4. Frequency characteristics of each low-pass filter of the 2-multiplexing filter banks 42, 44 and 46 correspond to the filter C shown in FIG. 4, and frequency characteristics of each high-pass filter of the same filter banks correspond to the filter D in FIG. 4. Then, the filters A and B are used for the 2-multiplexing filter bank 47 of the last stage, and a 2-multiplexing filter bank including the filter A and the filter B is connected to a previous stage of the filter A or C, and a 2-multiplexing filter bank including the filter C and the filter D is sequentially connected to a previous stage of the filter B or D. By the way, frequency characteristics of each filter shown in FIG. 4 are obtained by performing normalization using a sampling frequency fs of an output signal of the 2-multiplexing filter bank such that the passband falls within 0-fs.

Each of the 2-multiplexing filter banks up-samples each of the two input signals into doubled sampling frequency, removes unnecessary harmonic component from the up-sampled signals using each filter, and combines the signals from which the harmonic component has been removed, that is, frequency-multiplexes the signals. More particularly, 2-multiplexing filter banks 41, 42, 43 and 44 respectively receive digital signals S41 and S42, S43 and S44, S45 and S46, and S47 and S48 to frequency-multiplex them and output an output signal to the selector 48.

The 2-multiplexing filter bank 45 receives an output signal of the 2-multiplexing filter bank 41 or the signal S31 that is selected by one selector 48 and an output signal of the 2-multiplexing filter bank 42 or the signal S32 that is selected by another selector 48, and frequency-multiplexes them to output. In the same way, the 2-multiplexing filter bank 46 receives an output signal of the 2-multiplexing filter bank 43 or the signal S33 that is selected by one selector 48 and an output signal of the 2-multiplexing filter bank 44 or the signal S34 that is selected by another selector 48, and frequency-multiplexes them to output.

The adder 491 adds the output signal of the 2-multiplexing filter bank 45 or the signal S21 that is selected by the selector 481 and a signal S51 from the after-mentioned frequency conversion and interpolator unit 5, and the adder 492 adds the output signal of the 2-multiplexing filter bank 46 or the signal S22 that is selected by the selector 482 and a signal S52 from the after-mentioned frequency conversion and interpolator unit 5. The 2-multiplexing filter bank 47 receives output signals of the adders 491 and 492 to frequency-multiplex them to output.

Lastly, the selector 483 selects an output signal of the 2-multiplexing filter bank 47 or the signal S11 to output it to the adder 493, and the adder 493 adds the signal from the selector 483 and the signal S61 from the frequency conversion and interpolator unit 5 to generate an output signal of the digital signal multiplexing apparatus.

By the way, the configuration of the multiplexing filter bank unit 4 of the digital signal multiplexing apparatus of the embodiment of the present invention is not limited to the above-mentioned configuration as long as it is configured to sequentially perform, by using a multistage configuration, outputting a plurality of input signals of predetermined bands as a frequency multiplexed signal placed on fixed frequency bands. For example, the multiplexing filter bank unit 4 may be configured to connect unit multiplexing filter banks in a multistage manner, each of the unit multiplexing filter banks including one or more up-samplers for up-sampling and outputting the input signal, and a filter for removing unnecessary component of output signals of each up-sampler to output them. By the way, the 2-multiplexing filter bank is an example of the unit multiplexing filter bank.

Figure 12A:
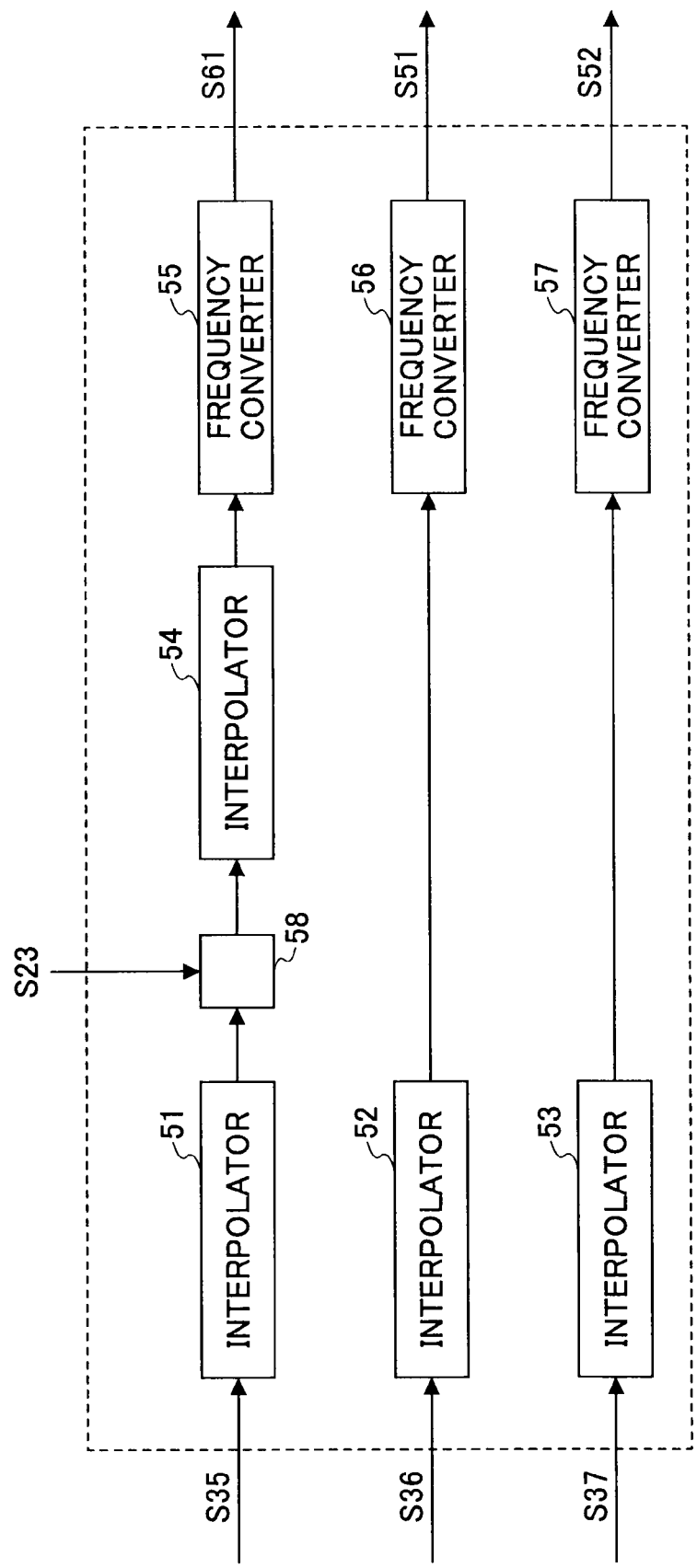
FIG. 12A is a block diagram of a frequency conversion and interpolator unit.

FIG. 12A is a block diagram of the frequency conversion and interpolator unit 5. According to FIG. 12A, the frequency conversion and interpolator unit 5 includes interpolators 51-54, frequency converters 55-57, and a selector 58.

Figure 12B:
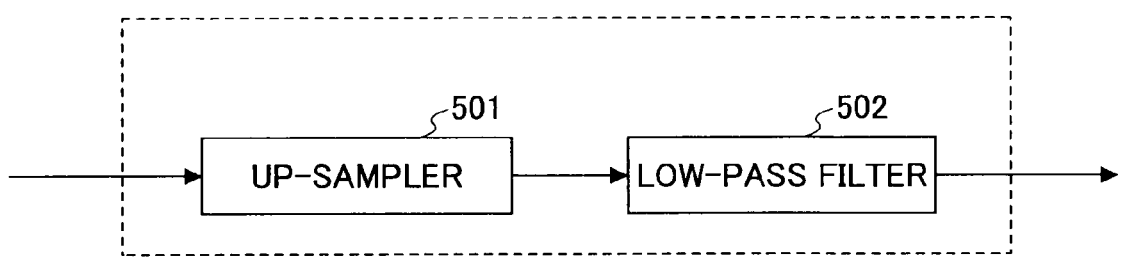
FIG. 12B is a block diagram of an interpolator.

As shown in FIG. 12B, each interpolator includes an up-sampler 501, and a low-pass filter 502 for passing only necessary signal component to remove unnecessary signal component from an output signal, including image component, generated as a result of up-sampling by the up-sampler 501. The up-sampler 501 has a function for converting the sampling frequency to double by interpolating a sample values of 0 between sample values of the input signal. As the low-pass filter 502, one of the filters A-D shown in FIG. 4 can be used. The sampling frequency fs is a sampling frequency of the output signal of the interpolator.

Like the frequency converters 21-23, the frequency converters 55-57 shift the frequency of the input signal to output it.

The interpolator 51 up-samples the signal S35, and after that, removes harmonic component, and the selector 58 selects the signal S23 or the output signal of the interpolator 51 to output it. The interpolator 54 up-samples the output signal of the selector 58, and after that, removes harmonic component, and the frequency converter 55 converts the frequency of the output signal of the interpolator 54 to output the signal S61. In the same way, the interpolator 52 up-samples the signal S36, and after that, removes harmonic component, and the frequency converter 56 converts the frequency of the output signal of the interpolator 52 to output the signal S51. The interpolator 53 up-samples the signal S37, and after that, removes harmonic component, and the frequency converter 57 converts the frequency of the output signal of the interpolator 52 to output the signal S52.

FIG. 13 shows frequency positions and frequency bands of each of the above-mentioned signals in the frequency multiplexed signal output by the digital signal multiplexing apparatus. The sampling frequency Fs is a sampling frequency of the output signal of the 2-multiplexing filter bank 47 located at the last stage. In addition, when using a signal S23, a frequency shift amount in the frequency converter 55 is an amount indicated by an arrow with a dotted line located at the left side of the signal S23, and when using a signal S35, a frequency shift amount in the frequency converter 55 is an amount indicated by an arrow with a dotted line located at the left side of the signal S35. In the same way, a frequency shift amount in the frequency converter 56 is an amount indicated by an arrow with a dotted line located at the left side of the signal S36, and a frequency shift amount in the frequency converter 57 is an amount indicated by an arrow with a dotted line located at the left side of the signal S37. By the way, these frequency shifts mean shifting to the right side by the amount according to each arrow with dotted line, that is, to a high frequency side.

In this case, as the low pass filter 201 of the interpolators 51, 52 and 54, the filter A shown in FIG. 4 is used, and the filter C shown in FIG. 4 is used for the low-pass filter 502 of the interpolator 53. However, when shifting a frequency from the frequency position of the signal S31 so as to become the same as the frequency of the signal S37 by increasing the frequency shift amount of the frequency converter 57, the filter A of FIG. 4 can be also used as the low-pass filter 502 of the interpolator 53. That is, the frequency shift amount in each frequency converter is determined by frequency characteristics of the low-pass filter used for the one or more interpolators that are serially connected to the previous stage. More particularly, the frequency shift amount in each frequency converter is determined by frequency characteristics of the low-pass filter used for the one or more interpolators that are serially connected to the previous stage and a frequency position of a signal that is filtered by the low-pass filter in the frequency multiplexed signal. The frequency is shifted such that the signal that is filtered by the low-pass filter is located at a desired frequency position in the frequency multiplexed signal.

Also in the configuration of FIG. 12A, like the configuration of FIG. 9A, by configuring the frequency converter to be able to change the frequency shift amount, the circuit for outputting the signal S61 from the signal S23 or S35 is shared. Of course, a configuration may be adopted in which the circuit configured by the frequency converter 55 and the interpolators 51 and 54 is used only for the signal S35 and a circuit used only for the signal S23 is separately provided so as to finally select an output signal using the selector 58.

Returning back to FIG. 10, the switch matrix unit 3 is for guiding the up to eight input signals input to the digital signal multiplexing apparatus to predetermined inputs of the multiplexing filter bank unit 4 and/or frequency conversion and interpolator unit 5.

According to the above-mentioned configuration, restriction for combination of usable signals, which is the problem in the conventional technique, can be removed. For example, processing for signal groups shown in FIGS. 6C and 6D becomes possible.

By the way, in the above-mentioned digital signal demultiplexing apparatus and the digital signal multiplexing apparatus, the number of 2-demultiplexing or 2-multiplexing filter banks to be used, the processing circuit configured by a frequency converter and one or more decimators in the frequency converter and decimator unit 2, and the processing circuit configured by the one or more interpolators and one frequency converter in the frequency conversion and interpolator unit 5 can be selected as necessary according to a combination of desired signals. For example, when fixedly using only two signals shown in FIG. 6D, 2-demultiplexing filter banks 13 and 15-17 of FIG. 8, the processing circuits starting from the frequency converters 22 and 23, the 2-multiplexing filter banks 42-44 and 46 shown in FIG. 11, and processing circuits starting from the interpolators 52 and 53 of FIG. 12A are not essential. In addition, since S47 is not used, the high-pass filter and the down-sampler connected to the output of the high-pass filter in the 2-demultiplexing filter bank 17, and the high-pass filter and the up-sampler connected to the previous stage of the high-pass filter in the 2-multiplexing filter bank 44 can be also omitted. Similarly, the switch matrix unit 3 is for flexibly changing the combination of signals to be used, and it can be omitted when the signals to be used are fixed and not changed.

Figure 14A:
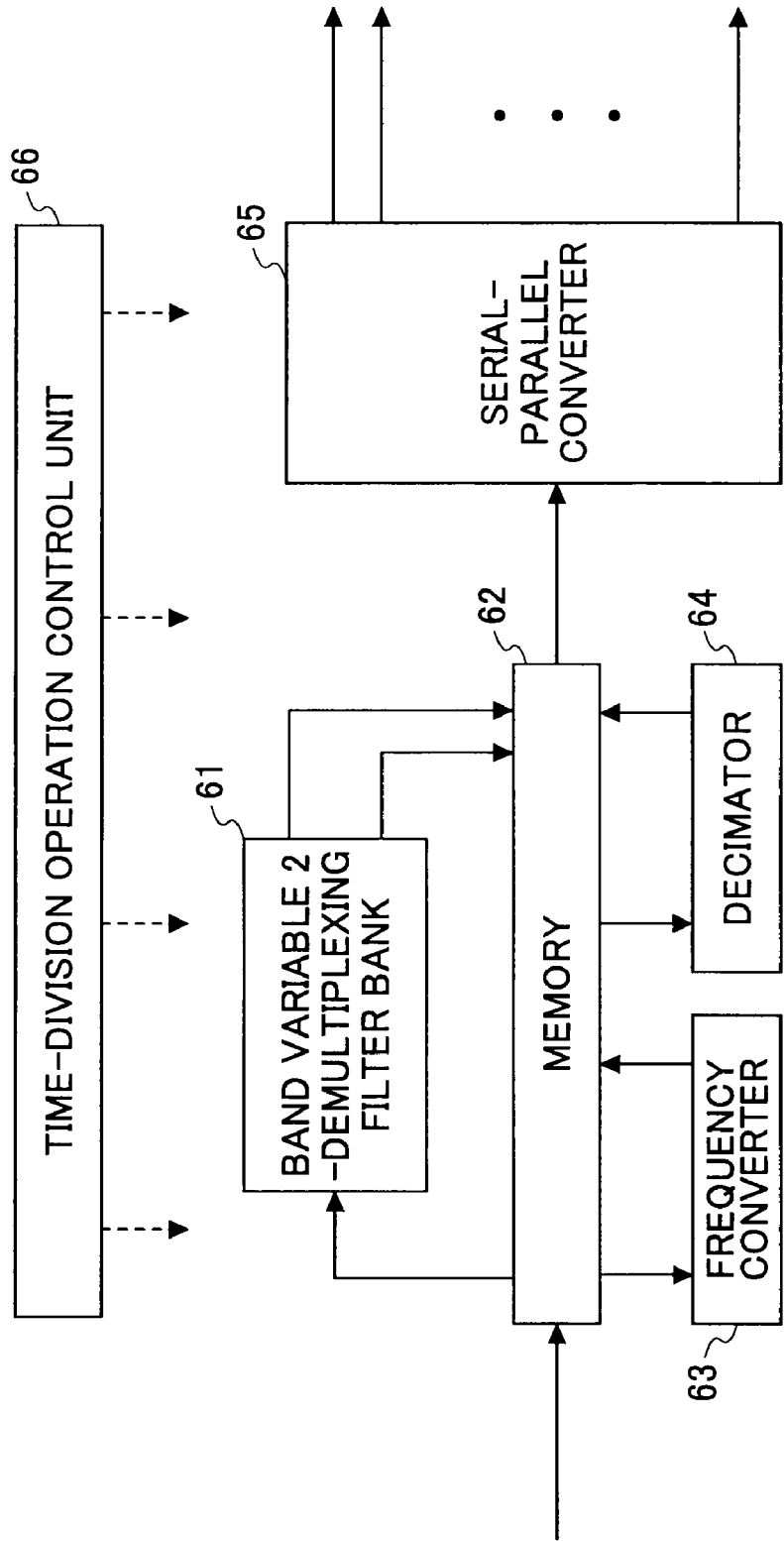
FIG. 14A is a block diagram of other embodiment of the digital signal demultiplexing apparatus.
Figure 14B:
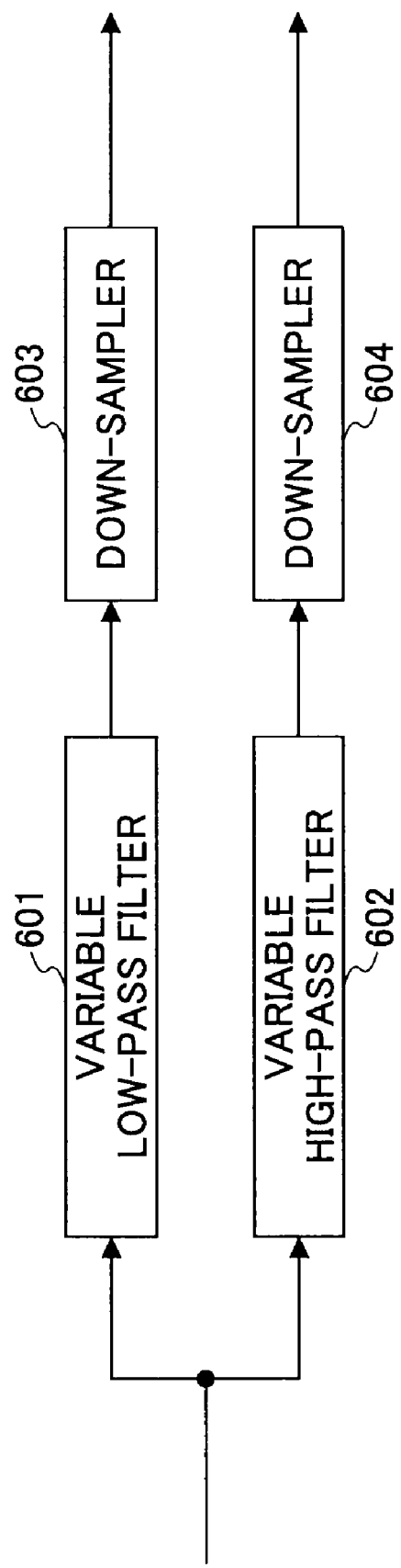
FIG. 14B is a block diagram of a band variable 2-demultiplexing filter bank.

FIG. 14A is a block diagram of other embodiment of the digital signal demultiplexing apparatus. According to FIG. 14A, the digital signal demultiplexing apparatus includes a band variable 2-demultiplexing filter bank 61, a memory 62, a frequency converter 63, a decimator 64, a serial-parallel converter 65 and a time-division operation control unit 66. As shown in FIG. 14B, the band variable 2-demultiplexing filter bank 61 includes a variable low-pass filter 601, a variable high-pass filter 602 and down-samplers 603 and 604.

The variable low-pass filter 601 can switch between the filter A and the filter C shown in FIG. 4 based on control from the time division operation control unit 66, and the variable high-pass filter 602 can switch between the filter B and the filter D shown in FIG. 4 based on control from the time division operation control unit 66. These switching between passbands can be realized by known various methods such as switching between prepared two kinds of passband filters, or changing tap coefficients of the digital filter, or the like.

Each of the down-samplers 603 and 604 has a function for alternately thinning out sample values of the input signal, that is, down-sampling the sampling frequency into half. The frequency converter 63 has a function for frequency-converting the input signal based on control of the time-division operation control unit 66, and the decimator 64 is the same as one shown in FIG. 9B.

The present embodiment is characterized by performing processes the same as processes shown in FIGS. 8, 9A and 9B in a time-division manner by using the memory 62. That is, the input signal S11 is stored in the memory 62, and the signal S11 is processed by configuring the band variable 2-demultiplexing filter bank 61 to be the same as the 2-demultiplexing filter bank 11 of FIG. 8, and the output signals S21 and S22 are stored in the memory 62 in the same way. In the same way, for the signal S21 stored in the memory 62, the signal S21 is read from the memory 62 and is processed by configuring the band variable 2-demultiplexing filter 61 to be the same as the 2-demultiplexing filter bank 12 of FIG. 8, and the output signals S31 and 32 are stored in the memory 62. Further, when using the signal S35, the frequency shift amount of the frequency converter 63 is set as shown in FIG. 13 so as to read the signal S35 from the memory 62 to process it, and after that, processes are performed two times by the decimator 64 via the memory 62.

The time-division operation control unit 66 is for controlling each unit for the time division processing, and the serial-parallel converter 65 sequentially reads each signal stored in the memory 62 to output it. By the way, in FIG. 14A, although one band variable 2-demultiplexing filter bank 61, one frequency converter 63 and one decimator 64 are prepared, more than one for each of them may be prepared.

Figure 15A:
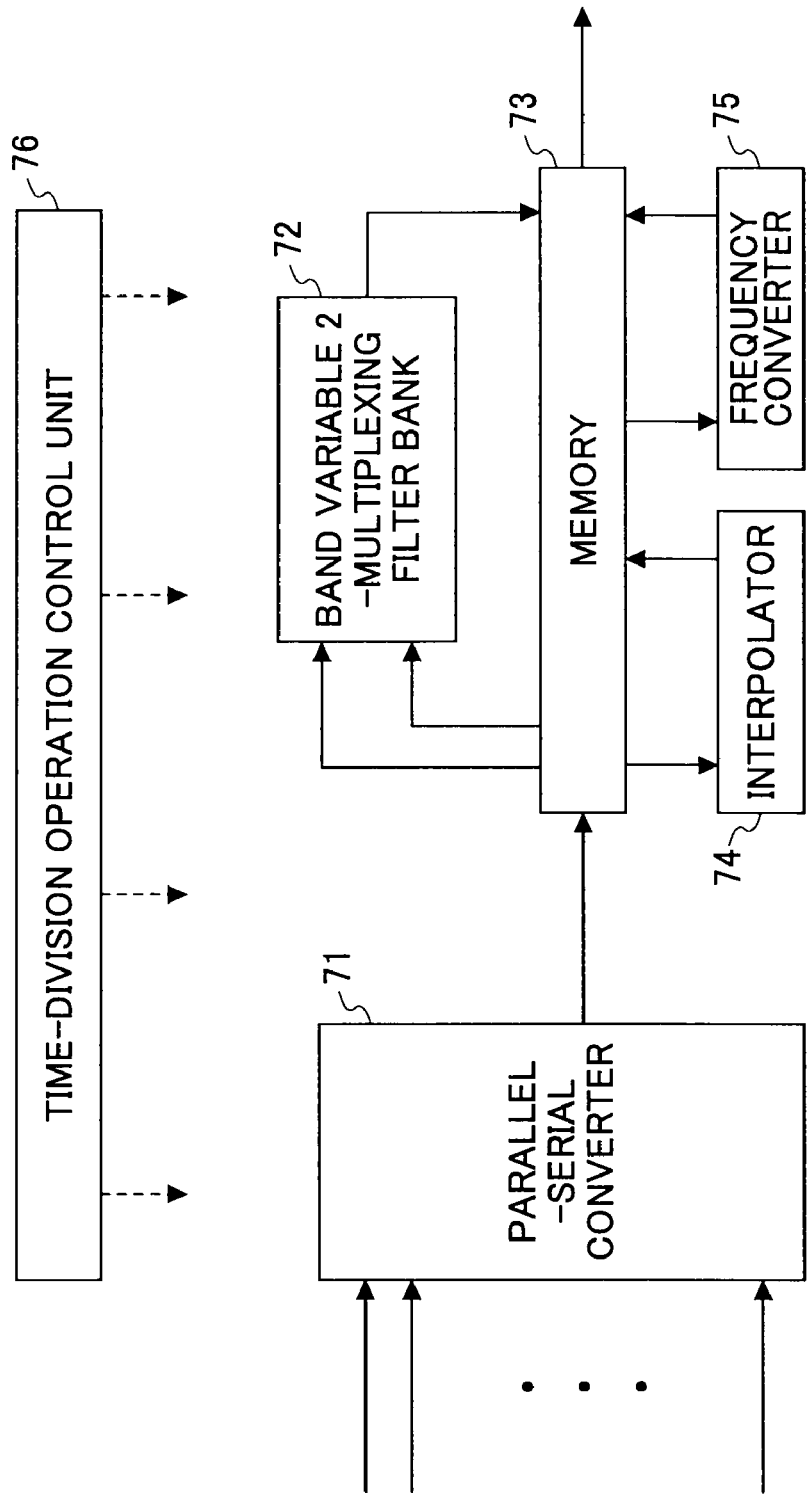
FIG. 15A is a block diagram of other embodiment of the digital signal multiplexing apparatus.
Figure 15B:
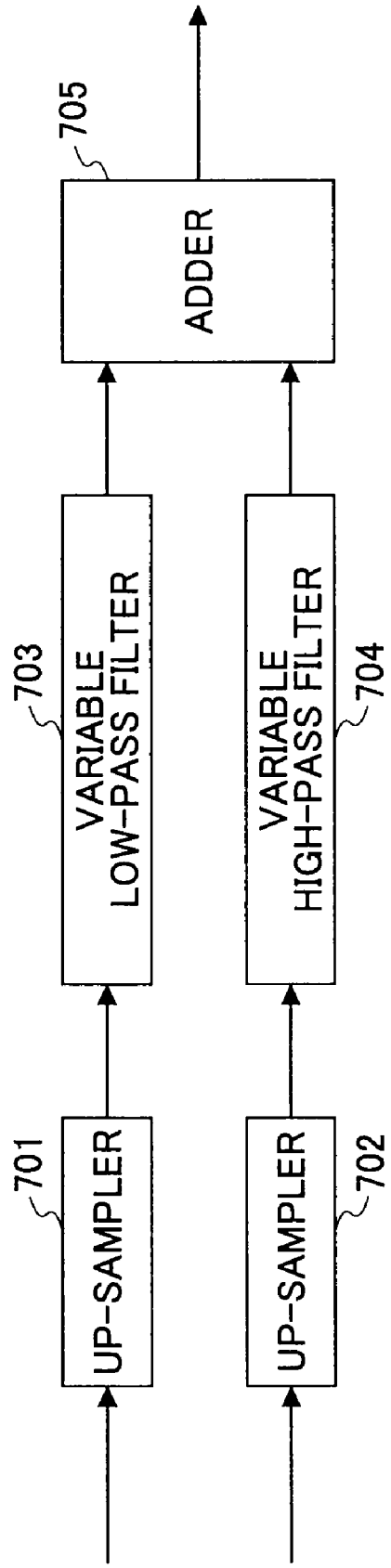
FIG. 15B is a block diagram of a band variable 2-multiplexing filter bank.

FIG. 15A is a block diagram of the digital signal multiplexing apparatus of other embodiment. According to FIG. 15A, the digital signal multiplexing apparatus includes a parallel-serial converter 71, a band variable 2-multiplexing filter bank 72, a memory 73, an interpolator 74, a frequency converter 75 and a time-division operation control unit 76. As shown in FIG. 15B, the band variable 2-multiplexing filter bank 72 includes an up-samplers 701 and 702, a variable low-pass filter 703, a variable high-pass filter 704 and an adder 705.

Like the variable low-pass filter 601 shown in FIG. 14B, the variable low-pass filter 703 can switch between the filer A and the filter C of FIG. 4 based on control from the time-division operation control unit 76, and like the variable high-pass filter 602 shown in FIG. 14B, the variable high-pass filter 704 can switch between the filer B and the filter D of FIG. 4 based on control from the time-division operation control unit 76. In addition, each of the up-samplers 701 and 702 has a function for converting the sampling frequency to double by interpolating a sample value of 0 between sample values of the input digital signal, the frequency converter 75 has a function for converting the input signal to a signal of a predetermined frequency based on control of the time-division operation control unit 76, and the interpolator 74 is the same as that shown in FIG. 12B.

Like the digital signal demultiplexing apparatus shown in FIG. 14A, the present embodiment is characterized by performing processes same as those of FIGS. 11, 12A and 12B in a time-division manner by using the memory 73. That is, the input digital signals S41 and S42 are stored in the memory 73, and the digital signals S41 and S42 are multiplexed by configuring the band variable 2-multiplexing filter bank 72 to be the same as the 2-multiplexing filter bank 41 of FIG. 11, and the multiplexed signal is stored in the memory 73. In addition, when using the digital signal S36, the interpolator 74 processes the signal S36, and after once storing the signal in the memory 73, the frequency converter 75 reads the signal processed by the interpolator 74 from the memory 73 to perform frequency conversion by setting the frequency shift amount of the frequency converter 75 as shown in FIG. 13.

The parallel-serial converter 71 converts a plurality of input signals to a serial signal to store it into the memory 73, and the time-division operation control unit 76 controls each part for performing the time-division processing. By the way, in the configuration shown in FIG. 15A, although one band variable 2-multiplexing filter bank 72, one interpolator 74, and one frequency converter 75 are prepared, the number of each of them may be more than one.

As mentioned above, by performing demultiplexing and/or multiplexing of the digital signal in a time-division manner, it becomes possible to perform demultiplexing and/or multiplexing of the digital signal with small circuit configuration, and it becomes possible to flexibly respond to change of combination of signals to be used.

As mentioned above, according to embodiments of the present invention, a digital signal demultiplexing apparatus for demultiplexing a received signal including a plurality of signals that are frequency-multiplexed to output demultiplexed signals is provided. The digital signal demultiplexing apparatus includes:

demultiplexing filter bank means including a configuration in which unit demultiplexing filter banks are connected in a multistage manner, each unit demultiplexing filter bank including one or more filters for filtering an input signal and a down-sampler for down-sampling an output signal of each filter to output an down-sampled signal; and frequency conversion and decimator means configured to receive at least one of the received signal and output signals of each unit demultiplexing filter bank, wherein the frequency conversion and decimator means includes frequency conversion means, for each input signal, configured to shift a frequency of an input signal and output a shifted signal, and one or more decimator means serially connected to an output of each frequency conversion means, and the decimator means includes a filter for performing band limitation of an input signal and a down-sampler for down-sampling an output signal of the filter and output a down-sampled signal.

The digital signal demultiplexing apparatus may further includes switch matrix means configured to select one or more signals from among output signals of each unit demultiplexing filter bank and output signals of each decimator means to output the one or more signals. By the switch matrix means, it becomes possible to flexibly change of bands and frequency placement of signals to be used.

In the digital signal demultiplexing apparatus, a frequency shift amount in the frequency conversion means may be variable. By configuring the frequency conversion means to be able to change the frequency shift amount, configuration of the frequency conversion and interpolator means can be simplified.

In the digital signal demultiplexing apparatus, at least one of the frequency conversion means, the decimator means, and the unit demultiplexing filter bank may be realized by time-division processing using a memory for storing input and output signals of each means. By realizing each means by the time-division processing using a memory, the circuit size can be further decreased.

In the digital signal demultiplexing apparatus, the frequency conversion means may shift a frequency of a signal, in a plurality of signals included in the received signal, that cannot pass through a passband of the demultiplexing filter bank means such that the signal falls within a passband of the decimator means serially connected to a subsequent stage.

In addition, in the digital signal demultiplexing apparatus, the unit demultiplexing filter bank may be a 2-demultiplexing filter bank including one or two filters for filtering an input signal and a down-sampler for down-sampling an output signal of each filter to output a down-sampled signal.

In addition, in the digital signal demultiplexing apparatus, when a sampling frequency of an input signal is defined as fs, and four types of filters having passbands that are different with each other within a range from 0 to fs are defined as a first filter, a second filter, a third filter and a fourth filter in ascending order of passbands, the 2-demultiplexing filter bank is classified to a first 2-demultiplexing filter bank including the first filter and/or the second filter, and a second 2-demultiplexing filter bank including the third filter and/or the fourth filter, multistage connection of the 2-demultiplexing filter banks in the demultiplexing filter bank means may be preferably configured by connecting a signal that has been filtered by the first filter or the third filter and down-sampled to the first 2-demultiplexing filter bank, and connecting a signal that has been filtered by the second filter or the fourth filter and down-sampled to the second 2-demultiplexing filter bank, and the down-sampler in each of the 2-demultiplexing filter banks and the decimator means may convert a sampling frequency to half.

In addition, according to an embodiment of the present invention, a digital signal multiplexing apparatus for frequency-multiplexing a plurality of input signals and outputting a frequency-multiplexed signal is provided. The digital signal multiplexing apparatus includes:
multiplexing filter bank means including a configuration in which unit multiplexing filter banks are connected in a multistage manner, each unit multiplexing filter bank including one or more up-samplers for up-sampling an input signal and output an output signal, and a filter for removing unnecessary component of the output signal of each up-sampler to output an output signal; and
frequency conversion and interpolator means configured to output at least one signal to be added to any one of output signals of the unit multiplexing filter banks,
wherein the frequency conversion and interpolator means includes combinations each of which has one or more serially connected interpolator means and frequency conversion means configured to shift a signal output by last interpolator means to output a frequency-shifted signal, the number of the combinations being the same as the number of output signals, and
the interpolator means includes an up-sampler for up-sampling an input signal to output an output signal, and a filter for removing unnecessary signal component of the output signal of the up-sampler to output an output signal.

The present invention is not limited to the specifically disclosed embodiments, and variations and modifications may be made without departing from the scope of the present invention.

The present international application claims priority based on Japanese patent application No. 2006-140361, filed in the JPO on May 19, 2006 and the entire contents of the Japanese patent application No. 2006-140361 is incorporated herein by reference.

The invention claimed is:

1. A digital signal demultiplexing apparatus for demultiplexing a received signal including a plurality of signals that are frequency-multiplexed to output demultiplexed signals, comprising:
a demultiplexing filter bank part including a configuration in which unit demultiplexing filter banks are connected in a multistage manner, each unit demultiplexing filter bank including one or more filters for filtering a first input signal and a down-sampler for down-sampling an output signal of each filter to output a down-sampled signal; and
a frequency conversion and decimator part configured to receive at least one of the output signals of each unit demultiplexing filter bank, wherein
the frequency conversion and decimator part includes a frequency conversion part, for each second input signal, configured to shift a frequency of the input signal and output a shifted signal, and one or more decimator parts serially connected to an output of the frequency conversion part, and at least one of the decimator parts includes a filter for performing band limitation of a filter input signal and a down-sampler for down-sampling an output signal of the filter and outputting a down-sampled signal, and
the frequency conversion and decimator part receives the second input signal that is arranged in one of frequency bands fixedly divided by the demultiplexing filter bank part, and outputs a signal that straddles a boundary of the divided frequency bands, the frequency conversion and decimator part receiving the second input signal, which is output from a unit demultiplexing filter bank that is placed at a last stage among unit demultiplexing filter banks through which the signal that straddles the boundary pass.

2. The digital signal demultiplexing apparatus as claimed in claim 1, further comprising a switch matrix part configured to select at least one signal from among output signals of each unit demultiplexing filter bank and output signals of each decimator part to output the at least one signal.

3. The digital signal demultiplexing apparatus as claimed in claim 1 or 2, wherein a frequency shift amount in the frequency conversion part is variable.

4. The digital signal demultiplexing apparatus as claimed in claim 1 or 2, wherein at least one of the frequency conversion part, the decimator part, and the unit demultiplexing filter bank part is realized by time-division processing using a memory for storing input and output signals of each part.

5. The digital signal demultiplexing apparatus as claimed in claim 1 or 2, wherein the frequency conversion part shifts a frequency of a signal, in a plurality of signals included in the received signal, that cannot pass through a passband of the demultiplexing filter bank part such that the signal falls within a passband of the at least one decimator part serially connected to a subsequent stage.

6. The digital signal demultiplexing apparatus as claimed in claim 1 or 2, wherein the unit demultiplexing filter bank is a 2-demultiplexing filter bank including at least one filter for filtering an input signal and a down-sampler for down-sampling an output signal of each filter to output a down-sampled signal.

7. The digital signal demultiplexing apparatus as claimed in claim 6, wherein, when a sampling frequency of an input signal is defined as fs, and four types of filters having passbands that are different with each other within a range from 0 to fs are defined as a first filter, a second filter, a third filter and a fourth filter in ascending order of passbands,
- a 2-demultiplexing filter bank is classified to a first 2-demultiplexing filter bank including at least one of the first filter and the second filter, and a second 2-demultiplexing filter bank including at least one of the third filter and the fourth filter,
- multistage connection of the 2-demultiplexing filter banks in the demultiplexing filter bank part is configured by connecting a signal that has been filtered by the first filter or the third filter and down-sampled to the first 2-demultiplexing filter bank, and connecting a signal that has been filtered by the second filter or the fourth filter and down-sampled to the second 2-demultiplexing filter bank, and
- the down-sampler in each of the 2-demultiplexing filter banks and the at least one decimator part converts a sampling frequency to half.

8. A digital signal multiplexing apparatus for frequency-multiplexing a plurality of input signals and outputting a frequency-multiplexed signal, comprising:
- a multiplexing filter bank part including a configuration in which unit multiplexing filter banks are connected in a multistage manner, each unit multiplexing filter bank including one or more first up-samplers for up-sampling a first input signal and output a first up-sampled output signal, and a filter for removing unnecessary component of the first up-sampled output signal of each up-sampler to output a first output signal; and
- a frequency conversion and interpolator part configured to output at least one signal to be added to any one input signals of the unit multiplexing filter banks, wherein
- the frequency conversion and interpolator part includes combinations, each of which has one or more serially connected interpolator part and frequency conversion parts configured to shift a signal output by last interpolator part to output a frequency-shifted signal, the number of the combinations being the same as the number of output signals,
- at least one of the interpolator parts includes a second up-sampler for up-sampling a second input signal to output a second up-sampled output signal, and a filter for removing unnecessary signal component of the second up-sampled output signal of the up-sampler to output a second output signal, and
- the frequency conversion and interpolator part receives a signal that straddles a boundary of fixedly divided frequency bands, and outputs an output signal that is arranged in one of the fixedly divided frequency bands, the frequency conversion and interpolator part adding the output signal to the input signal of a unit multiplexing filter bank that is placed at a first stage among unit multiplexing filter banks through which the signal that straddles the boundary pass.

* * * * *

UNITED STATES PATENT AND TRADEMARK OFFICE
CERTIFICATE OF CORRECTION

| | | |
|---|---|---|
| PATENT NO. | : 7,936,742 B2 | Page 1 of 1 |
| APPLICATION NO. | : 12/296758 | |
| DATED | : May 3, 2011 | |
| INVENTOR(S) | : Kiyoshi Kobayashi et al. | |

It is certified that error appears in the above-identified patent and that said Letters Patent is hereby corrected as shown below:

Col. 16
On line 58 of claim 4, remove the word "unit" before the word demultiplexing.

Signed and Sealed this
Ninth Day of August, 2011

David J. Kappos
*Director of the United States Patent and Trademark Office*